US009696639B2

(12) United States Patent
Mueller et al.

(10) Patent No.: US 9,696,639 B2
(45) Date of Patent: Jul. 4, 2017

(54) PROJECTION EXPOSURE SYSTEM FOR MICROLITHOGRAPHY WITH A MEASUREMENT DEVICE

(71) Applicant: Carl Zeiss SMT GmbH, Oberkochen (DE)

(72) Inventors: Ulrich Mueller, Aalen (DE); Joachim Stuehler, Aalen (DE); Oswald Gromer, Heidenheim (DE); Rolf Freimann, Aalen (DE); Paul Kaufmann, Aalen (DE); Bernhard Geuppert, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 7 days.

(21) Appl. No.: 14/679,221

(22) Filed: Apr. 6, 2015

(65) Prior Publication Data

US 2015/0212431 A1    Jul. 30, 2015

Related U.S. Application Data

(63) Continuation of application No. 12/838,393, filed on Jul. 16, 2010, now Pat. No. 9,001,304, which is a
(Continued)

(51) Int. Cl.
*G03B 27/42* (2006.01)
*G03F 7/20* (2006.01)

(52) U.S. Cl.
CPC .......... *G03F 7/70775* (2013.01); *G03F 7/706* (2013.01); *G03F 7/7085* (2013.01);
(Continued)

(58) Field of Classification Search
CPC ............. G03F 7/70725; G03F 7/70633; G03F 7/7085; G03F 7/70775; G03F 7/70825; G03F 7/70266; G03F 9/70
See application file for complete search history.

(56) References Cited

U.S. PATENT DOCUMENTS 4,697,087 A    9/1987 Wu
4,967,088 A    10/1990 Stengl et al.
(Continued)

FOREIGN PATENT DOCUMENTS

CN    1488998 A    4/2004
CN    1488999 A    4/2004
(Continued)

OTHER PUBLICATIONS

Office Action in corresponding Korean Application No. 10-2010-7018019, dated May 20, 2015, along with an English translation.
(Continued)

*Primary Examiner* — Mesfin Asfaw
(74) *Attorney, Agent, or Firm* — Edell, Shapiro & Finnan, LLC

(57) ABSTRACT

A projection exposure system (10) for microlithography which includes: a mask holding device (14) holding a mask (18) with mask structures (20) disposed on the mask, a substrate holding device (36) holding a substrate (30), projection optics (26) imaging the mask structures (20) onto the substrate (30) during an exposure process, and a measurement structure (48) disposed in a defined position with respect to a reference element (16) of the projection exposure system (10), which defined position is mechanically uncoupled from the position of the mask holding device (14). The projection exposure system (10) also includes a detector (52) arranged to record an image of the measurement structure (48) imaged by the projection optics (26). The projection exposure system (10) is configured such that during operation of the projection exposure system (10) the imaging of the mask structures (20) and the imaging of the measurement structure (48) take place at the same time by the projection optics (26. An evaluation device (54) is configured to establish a lateral position of the image of the
(Continued)

measurement structure (48) in the area of the detector (52) during the exposure process.

10 Claims, 11 Drawing Sheets

Related U.S. Application Data continuation of application No. PCT/EP2009/000006, filed on Jan. 2, 2009.

(60) Provisional application No. 61/011,313, filed on Jan. 16, 2008.

(52) U.S. Cl.
CPC ...... *G03F 7/70258* (2013.01); *G03F 7/70633* (2013.01); *G03F 7/70725* (2013.01); *G03F 7/70891* (2013.01)

(56) References Cited

U.S. PATENT DOCUMENTS

| | | | |
|---|---|---|---|
| 4,985,634 A | 1/1991 | Stengl et al. | |
| 5,841,520 A | 11/1998 | Taniguchi | |
| 5,978,069 A | 11/1999 | Kato | |
| 5,995,198 A | 11/1999 | Mizutani | |
| 6,078,641 A | 6/2000 | Mitsui et al. | |
| 6,100,978 A | 8/2000 | Naulleau et al. | |
| 6,118,516 A | 9/2000 | Irie et al. | |
| 6,532,056 B2 | 3/2003 | Osakabe et al. | |
| 6,724,463 B2 * | 4/2004 | Taniguchi | B60R 16/027 355/53 |
| 6,784,977 B2 | 8/2004 | von Beunau et al. | |
| 6,788,386 B2 | 9/2004 | Cox et al. | |
| 6,937,334 B2 | 8/2005 | Monshouwer et al. | |
| 7,108,946 B1 | 9/2006 | Lukanc et al. | |
| 7,221,460 B2 | 5/2007 | Ohtsuka | |
| 7,239,370 B2 | 7/2007 | Jansen et al. | |
| 7,383,929 B2 | 6/2008 | Korenaga | |
| 7,385,370 B2 | 6/2008 | Sekiguchi | |
| 2003/0035090 A1 | 2/2003 | Imai et al. | |
| 2003/0081213 A1 | 5/2003 | Oishi et al. | |
| 2003/0218141 A1 | 11/2003 | Queens et al. | |
| 2003/0234993 A1 | 12/2003 | Hazelton et al. | |
| 2004/0036940 A1 | 2/2004 | Hazelton et al. | |
| 2004/0119973 A1 | 6/2004 | Fukuhara et al. | |
| 2004/0179192 A1 | 9/2004 | Mizuno et al. | |
| 2004/0189963 A1 | 9/2004 | Ohsaki | |
| 2004/0189966 A1 | 9/2004 | Van Der Werf et al. | |
| 2006/0023179 A1 | 2/2006 | Tschischgale et al. | |
| 2006/0139598 A1 | 6/2006 | Van Dijsseldonk et al. | |
| 2006/0244950 A1 | 11/2006 | Wegmann | |
| 2009/0091727 A1 | 4/2009 | Kwan | |

FOREIGN PATENT DOCUMENTS

| | | |
|---|---|---|
| EP | 0254871 A2 | 2/1988 |
| EP | 0341848 A2 | 11/1989 |
| EP | 0445871 A1 | 3/1991 |
| EP | 0786071 B1 | 7/1997 |
| EP | 0955565 A2 | 11/1999 |
| EP | 1061561 A1 | 12/2000 |
| EP | 1496398 A1 | 1/2005 |
| EP | 1930773 A1 | 6/2008 |
| JP | 62229937 A | 10/1987 |
| JP | 05-047631 | 2/1993 |
| JP | 07240367 A | 9/1995 |
| JP | 09050955 A | 2/1997 |
| JP | 09-119811 | 5/1997 |
| JP | 11-074181 | 3/1999 |
| JP | 11143087 A | 5/1999 |
| JP | 11-251226 | 9/1999 |
| JP | 2004134756 A | 4/2004 |
| JP | 2003142363 A | 9/2004 |
| JP | 2004266273 A | 9/2004 |
| JP | 2004281654 A | 10/2004 |
| JP | 2005032889 A | 2/2005 |
| JP | 2006179930 A | 7/2006 |
| JP | 2007005507 A | 1/2007 |
| KR | 1019990045161 | 6/1999 |
| KR | 1020040010159 A | 1/2004 |
| WO | 0062127 A1 | 10/2000 |
| WO | 2006128713 A2 | 12/2006 |
| WO | 2007074134 A1 | 7/2007 |

OTHER PUBLICATIONS

G. Sommargren et al., "Sub-nanometer Interferometry for Aspheric Mirror Fabrication", Precision Science and Technology for Perfect Surfaces, pp. 329-335, published 1999.

English language translation of Taiwanese Office Action corresponding to Taiwanese Patent Application No. 098101510, dated Oct. 30, 2013.

English language translation of Japanese Office Action for counterpart Japanese Patent Application No. 2010-54260, dated Feb. 4, 2014.

\* cited by examiner

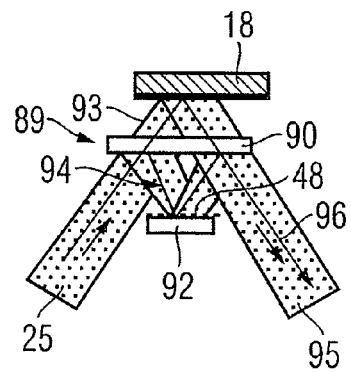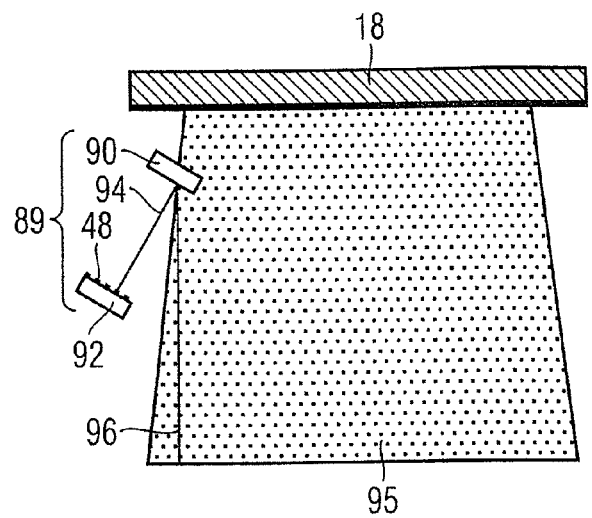
Fig. 8
Fig. 9
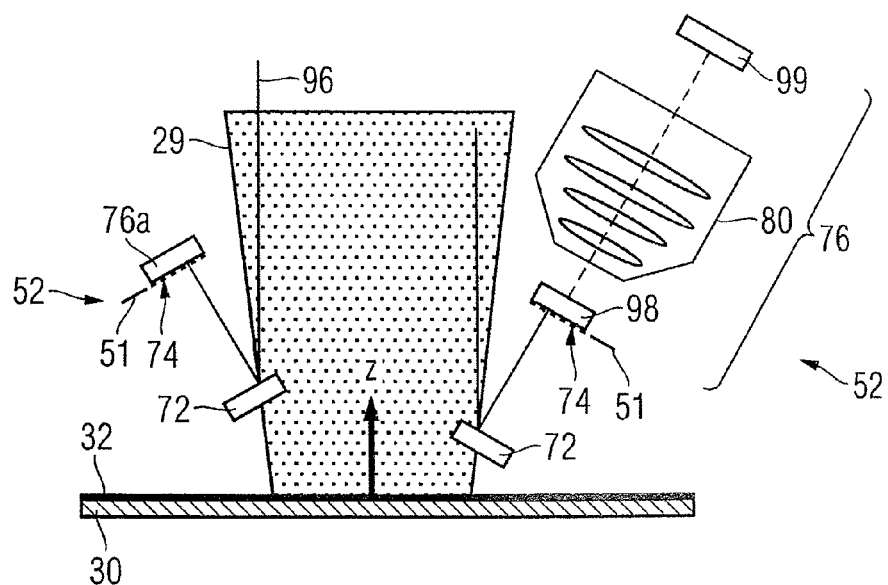
Fig. 10

PROJECTION EXPOSURE SYSTEM FOR MICROLITHOGRAPHY WITH A MEASUREMENT DEVICE

This application is a Continuation of U.S. patent application Ser. No. 12/838,393 filed Jul. 16, 2010, which is a Continuation of International Application PCT/EP2009/000006, with an international filing date of Jan. 2, 2009, which was published under PCT Article 21(2) in English, which claims priority of German Patent Application No. 10 2008 004 762.7 filed Jan. 16, 2008, as well as U.S. Provisional Application No. 61/011,313 filed Jan. 16, 2008. The entire disclosures of this U.S. Non-Provisional application, this International Application, this German Patent Application and this U.S. Provisional Application are incorporated into the present Continuation Application by reference.

FIELD OF AND BACKGROUND TO THE INVENTION

The invention relates to a projection exposure system for microlithography. This type of projection exposure system normally has a mask holding device in the form of a mask table or a so-called "reticle stage" for holding a mask or a so-called "reticle" with mask structures disposed on the latter. Furthermore, this type of projection exposure system normally comprises a substrate holding device in the form of a so-called "wafer stage" for holding a substrate in the form of a wafer and projection optics for imaging the mask structures onto the substrate.

With conventional projection exposure systems the quality of the image often suffers due to smearing. If the image position drifts over the wafer during exposure of a field, the latent image becomes smeared in the photoresist. This has the effect of superimposition errors or so-called "overlay" errors in the printed structures. These smearing problems occur to a particularly large extent with EUV projection exposure systems. EUV projection exposure systems expose structures with light with a wavelength in the extreme ultraviolet wavelength range, e.g. with a wavelength of 13.5 nm. In the roadmap of the semiconductor industry optical lithography plays an essential role in EUV. Only mirrors are considered here as optical components. With mirror optics a change in the position of the mirror and/or the mirror tilt setting leads as a first approximation to movement of the image. The requirements for mechanical stability of the optical components are substantially more stringent in comparison with refractive systems.

With conventional projection exposure systems the field position during the exposure of a wafer is monitored a number of times with appropriate adjustment or so-called "alignment" sensors, and corresponding correction measures are introduced. For this purpose the actual exposure process of the photoresist is interrupted. Between the control measurements one trusts in the short-term stability of the projection system. Conventional systems have relatively high short-term stability in comparison with EUV systems. The stability requirements for the image position when updating the conventional concept of image position control leads to an increase in the mechanical stability requirement in the image position of 1 nm with conventional systems to 0.2 nm with EUV systems over a period of 5 minutes. A main contribution to errors in the stability of the mirror positions is the thermal expansion of the mechanical base structure of the objective. In order to fulfil the stringent requirements set regarding image stability, one is currently following the path of using materials with extremely low thermal expansion coefficients for the structure of the projection objective. However, this type of material is extremely cost-intensive, sensitive and difficult to process.

OBJECTS

It is an object of the invention to solve the aforementioned problems, and in particular to provide a projection exposure system wherein smearing of the latent image in the photoresist is largely prevented.

SUMMARY

This and other objects can be achieved according to one aspect of the invention with a projection exposure system for microlithography which comprises: a mask holding device for holding a mask with mask structures disposed on the latter, a substrate holding device for holding a substrate, projection optics for imaging the mask structures onto the substrate during an exposure process, a measurement structure which is disposed in a defined position with respect to a reference element of the projection exposure system, which defined position is mechanically uncoupled from the position of the mask holding device, a detector arranged for recording an image of the measurement structure produced by imaging of the latter using the projection optics, the projection exposure system being configured such that during operation of the projection exposure system the imaging of the mask structures onto the substrate and the imaging of the measurement structure onto the detector take place at the same time, i.e. simultaneously or contemporaneously, i.e., at least partly overlapping in time, respectively with the projection optics. The projection exposure system further comprises an evaluation device which is configured to establish a lateral position of the image of the measurement structure in the area of the detector during the exposure process.

Furthermore, according to the another aspect of the invention a method for monitoring the lateral imaging stability of a projection exposure system for microlithography is provided. The method according to the invention comprises:

holding a mask with mask structures disposed on the latter using a mask holding device which is moveably mounted in relation to a reference element of the projection exposure system, a measurement structure being disposed in a defined position with respect to a reference element of the projection exposure system, which defined position is mechanically uncoupled from the position of the mask holding device, imaging the mask structures onto a substrate in an exposure process and imaging the measurement structure the area of a detector, the imaging of the mask structures and the imaging of the measurement structure respectively taking place at the same time with projection optics of the projection exposure system, recording the image of the measurement structure with the detector, and establishing a lateral position of the image of the measurement structure in the area of the detector during the exposure process.

According to another aspect of the invention a projection exposure system is provided with a measurement device designed to establish the lateral position of the image of the measurement structure in the area of the detector, in particular on the recording surface of the detector, which is advantageously a level surface. This measurement device preferably comprises the measurement structure, the detector and the evaluation device. The measurement device is therefore designed to monitor the lateral imaging stability of the projection exposure system, according to one embodiment the lateral imaging stability of the projection optics, during the exposure process.

The lateral position is established during the exposure process, i.e. at the same time as the exposure process of imaging the mask structures onto the substrate takes place, preferably several times in the course of the exposure process. According to one embodiment the term "exposure process" in this context refers to the exposure of only one field on the substrate which is performed in case of a step and scan exposure system in a continuous exposure, during which the mask and the substrate are scanned continuously. According to another embodiment the term "exposure process" refers to an exposure, which comprises several field exposures on a substrate, in particular the exposure of the entire substrate.

For this purpose the imaging of the mask structures and of the measurement structures is performed simultaneously or contemporaneously with the projection optics. The lateral position is understood as being the position of the image laterally to the propagation direction of the radiation producing the image in the area of the detector. In particular, the lateral position is the position of the image in a plane parallel to or coincident with the recording surface of the detector. If the optical beam imaging the measurement structure strikes the recording surface directly after passing through the projection optics, i.e. without being deflected, the lateral position of the image of the measurement structure is the position of the image in a plane lateral to the optical axis of the projection optics.

The reference element, with respect to which the measurement structure is disposed in a defined position can e.g. be a reference frame of a mask table or a so-called "reticle stage". Further possible reference elements will be described later. The mask holding device is mounted moveably in relation to this type of reference frame. This applies both to the case where the projection exposure system is in the form of a so-called "stepper" and in the case where the projection exposure system is designed as a so-called "scanner". With the embodiment as a "stepper", before exposing a field the mask holding device is moved in relation to the reference frame to the optimal alignment of the mask during exposure. With a "scanner", during exposure process of the respective field the mask holding device is additionally moved in relation to the reference frame and so in relation to the projection optics.

The defined position, in which the measurement structure is disposed with respect to the reference element can be obtained by continuous measurement of the distance between the measurement structure and the reference element or by fixing the measurement structure rigidly to the reference element, as will be described in more detail later. As mentioned above, the defined position is mechanically uncoupled from the position of the mask holding device. That means that the measurement structure is not coupled to the mask holding device. Therefore its position does not move with the position of the mask holding device. In particular, the measurement structure is not attached to the mask holding device and is not contained on the mask itself. The measurement structure is rather independent in its position from the mask holding device, in particular the mask holding device is moveable with respect to the measurement structure.

As already stated, according to an aspect of the invention a detector is provided for recording an image of the measurement structure produced by imaging with the projection optics in the area of the detector. Advantageously, this detector is independent of the substrate type. Therefore, the detector also functions if no substrate, e.g. in the form of a wafer, has been inserted into the substrate holding device. According to one embodiment the detector is in the form of an electro-optical detector which converts optical signals into electrical signals.

The optical path of the image of the measurement structure produced on the detector advantageously has a clearly producible correlation to the optical path of the mask structures imaged on the substrate and is representative of the mechanical movement of the components of the projection exposure system. Therefore, the lateral position of the image of the mask structures produced on the substrate can be established with a high degree of accuracy from the lateral position of the image of the measurement structure. For this purpose, if appropriate, the movement of the substrate holding device relative to the detector during the exposure process can be taken into consideration, as described in more detail later. As already stated above, according to this aspect of the invention the detector is disposed such that during operation of the projection exposure system the imaging of the mask structures onto the substrate and the imaging of the measurement structure onto the detector take place at the same time respectively using the projection optics.

Advantageously, the imaging of the mask structures onto the substrate is unaffected here by the imaging of the measurement structures onto the detector. Since the respective imaging of the mask structures and of the measurement structure take place at the same time, it is possible to correct the lateral position of the imaging while imaging the mask structures. Advantageously the projection exposure system is set up to correct the position of the lateral position of the image during the exposure process with the lateral position of the image of the measurement structure established by the evaluation device.

Aspects of the invention are based upon the insight that the smearing of the latent image in the photoresist observed with conventional projection exposure systems is caused to a substantial degree by a drift in the image position during exposure of a field on the substrate. By providing, according to one aspect of the invention, a measurement structure and an associated detector, the arrangement of the latter such that during operation of the projection exposure system the respective imaging of the mask structures and of the measurement structure takes place at the same time, and establishing the lateral position of the image, it is made possible to make a correction to the imaging characteristics during the mask structure imaging process.

The above-specified object may further be achieved with a projection exposure system for microlithography comprising: projection optics for imaging a mask onto a substrate during an exposure process, a measurement structure disposed in a fixed position in relation to the projection optics, a detector for recording an image of the measurement structure produced by imaging with the projection optics, and an evaluation device which is configured to establish a lateral position of the image of the measurement structure during the exposure process. In this context, disposing the measurement structure in a fixed position in relation to the projection optics does not necessarily mean absolutely rigid positioning of the elements in relation to one another, but rather that the measurement structure is not actively moveable in relation to the projection optics. On the other hand, the measurement structure can by all means be separated from the projection optics by vibration isolation.

According to an embodiment of the invention the projection exposure system is configured such that the measurement structure is imaged by the projection optics directly onto the detector, i.e. no optics other that the projection optics is arranged between the measurement structure and the detector.

According to a further embodiment of the invention the detector is disposed in a defined position with respect to a detector related reference element. The defined position, in which the detector structure is disposed with respect to the detector related reference element can be obtained by continuous measurement of the distance between the measurement structure and the detector related reference element or by fixing the measurement structure rigidly to the detector related reference element.

According to a further embodiment of the invention the first reference element, now referred to as measurement structure related reference element, and the detector related reference element are fixed to a common reference structure. that means the reference elements are respectively attached in a fixed position at the common reference structure.

According to a further embodiment of the invention the first reference element, now referred to as measurement structure related reference element, and the detector related reference element are identical, i.e. the same element.

According to a further embodiment of the invention the mask holding device is mounted moveably in relation to the measurement structure related reference element of the projection exposure system.

According to a further embodiment of the invention the substrate holding device is mounted moveably in relation to the detector related reference element.

According to a further embodiment of the invention the measurement structure and/or the detector are fixed rigidly to the associated reference element. That means the measurement structure is attached in a fixed position to the first reference element and/or the detector structure is attached in a fixed position to the detector related reference element. The fixation can be performed with a rigid connection element or by direct fixation at the respective reference element. This way the defined position of the measurement structure with respect to the first reference element and/or the detector with respect to the detector related reference element is obtained.

According to a further embodiment of the invention the projection exposure system comprises a distance sensor configured to obtain the respective defined position of the measurement structure and/or the detector by measuring its distance from the associated reference element. That means a distance sensor is provided for measuring the distance between the measurement structure and the first reference element in order to obtain the defined position of the measurement structure. If applicable, a further distance sensor measures the distance between the detector and the detector related reference element in order to obtain the defined position of the detector.

According to a further embodiment of the invention the measurement structure and/or the detector are attached to the projection optics, also referred to as projection objective, in a respective fixed position and a distance sensor is arranged to measure the distance between the projection optics and at least one reference element, especially to the first reference element. This way the defined position of the measurement structure and or the detector from the respective reference element is obtained. As mentioned above the measurement structure related reference element and the detector related reference element can be combined as a single reference element. In this case the distance between the projection optics and the single reference element is measured.

According to a further embodiment of the invention the measurement structure and/or the detector are attached to the projection optics in a respective fixed position and the distance sensor comprises two sensor modules, a first one arranged in order to measure the distance between the measurement structure and the measurement structure related reference element and a second one arranged in order to measure the distance between the detector and the detector related reference element.

According to a further embodiment of the invention the projection exposure system further comprises stage sensors configured to monitor the distance between the mask holding device and the measurement structure related reference element, as well as the distance between the substrate holding device and the detector related reference element during the exposure process, wherein the evaluation device is configured to evaluate the established lateral position of the image of the measurement structure and the distances established by the stage sensors and to establish therefrom a deviation of the imaging position of a respective mask structure on the substrate from its target position during the exposure process.

According to a further embodiment of the invention the reference element is the projection optics, the measurement structure is attached to the projection optics in a fixed position and the projection exposure system further comprises a sensor module, which is configured to measure the distance between the measurement structure and the mask holding device during the exposure process. This sensor module can e.g. be an optical position encoder.

According to a further embodiment of the invention the reference element is the projection optics, the detector is attached to the projection optics in a fixed position and the projection exposure system comprises a second sensor module configured to measure the distance between the detector and the substrate holding device during the exposure process.

In another embodiment according to the invention the evaluation device is configured to establish the lateral position of the image of the measurement structure produced in the area of the detector, in particular on the recording surface of the detector, during the exposure process in real time. Therefore, the evaluation device establishes the lateral position of the image of the measurement structure at the time when the measurement structure is produced. In this way it is possible to immediately correct the imaging characteristics of the projection exposure system, and in this way image smearing can be prevented particularly effectively. According to a further embodiment of the invention the projection exposure system further comprises a control device which is configured to manipulate the operation of the projection exposure system in real time in order to correct lateral imaging instabilities of the projection exposure system.

According to a further embodiment of the invention the evaluation device is configured to establish a lateral imaging stability of the projection exposure system during the exposure process using the established lateral position of the image of the measurement structure and the projection exposure system further comprises a control device configured to manipulate the operation of the projection exposure system during the exposure process such that lateral imaging instabilities of the projection exposure system established by the evaluation device are corrected. Thereby lateral image shifts occurring on the substrate during the exposure process can corrected.

According to a further embodiment of the invention the projection optics comprise a positioning device configured to change the position of an optical element of the projection optics. The positioning device can also be referred to as actuator. The position to be changed by the positioning device can be the location of the optical element in the coordinate system or the tilt of the optical element with respect to the optical axis of the projection optics.

According to a further embodiment of the invention the positioning device is arranged between the optical element and a counter mass to the optical element, which counter mass is arranged via a spring element to a frame element of the projection optics. This way movements of the optical element do not impact the stability of other optical elements in the projection optics.

According to a further embodiment of the invention the control device is configured to modify the position of the mask holding device and/or the position of the substrate holding device during the exposure process in order to correct the lateral imaging instabilities. In a case, in which the projection exposure system is configured as a step and scan system, also referred to as scanner, the control device modifies the scanning movement of the mask holding device and/or the substrate holding device such, that the lateral imaging instabilities are corrected for.

According to a further embodiment of the invention the substrate holding device comprises a base part, an adjustment part configured for holding the substrate and an actuator arranged to move the adjustment part with respect to the base part during the exposure process in order to correct lateral imaging instabilities. Advantageously, the adjustment part is lighter in weight compared to the base part. This way position adjustments to the adjustment part can be performed very fast.

According to a further embodiment of the invention the projection exposure system further comprises a pulsed radiation source providing illumination radiation for imaging the mask structures onto the substrate, wherein the control device is configured to trigger the radiation source based on the lateral imaging stability over time established by the evaluation device such that a radiation pulse is generated at a point in time, at which the lateral position of the image of the mask structures is within a predetermined tolerance with respect to a target position.

In a further embodiment according to the invention the evaluation device is configured to identify a change to the lateral position of the image of the measurement structure occurring over the temporal progression of the exposure process from the position of the image of the measurement structure in the area of the detector, in particular on the detector, established in real time, and furthermore the projection exposure system has a positioning device which is configured to change the position of at least one element of the projection exposure system, in particular the mask holding device, the substrate holding device and/or an optical element of the projection optics in order to correct the lateral position of the image of the measurement structure on the detector. The positioning device can concertedly act upon a number of elements of the projection optics. As already indicated above, in the case where the projection exposure system is in the form of a so-called "scanner", the correction to the position of the mask holding device or of the substrate holding device can include a correction to the movement sequence implemented during imaging of a field of the mask holding device or the substrate holding device. The lateral position of the image of the measurement structure can also be corrected by changing the position or the location of an optical element of the projection optics, such as for example of an individual mirror in the projection optics or by the co-ordinated movement of a number of mirrors. The aim of the correction measures to the positioning device is to keep the lateral position of the image of the measurement structure on the detector constant during the exposure process, and so to prevent a deviation of the lateral position of the image of the mask structures on the substrate from its lateral desired position during the exposure process.

According to a further embodiment of the invention the projection exposure system further comprises a control device which is configured to control the positioning device such that the position of the at least one element of the projection exposure system is corrected in real time resulting in the lateral position of the image of the measurement structure on the detector to remain stable during the exposure process. A correction in real time means that the correction is performed at the same time as the deviation of the lateral position of the image of the measurement structure is detected.

In a further embodiment according to the invention the projection exposure system is configured to image the mask structures with light in the EUV and/or higher frequency wavelength range onto the substrate. In other words, the projection exposure system is designed as an EUV exposure system which is operated with an exposure wavelength in the extreme ultraviolet wavelength range of e.g. 13.5 nm. As already mentioned at the start, the projection optics of an EUV projection exposure system is generally made up purely of reflective optical elements. Since a change to the position of this type of reflective optical element as a first approximation leads to a movement of the image on the substrate, this type of EUV projection exposure system benefits in particular from establishing, according to the invention, the lateral image position during the exposure process.

In a further embodiment according to the invention the evaluation device is configured to establish the lateral position of the image of the mask structures produced on the substrate from the image of the measurement structure recorded by the detector. The lateral position of the image of the mask structures is understood as meaning the position of the image in the imaging plane. In general, the substrate, e.g. in the form of a wafer, is located in this imaging plane. The lateral position of the image of the mask structures determined by the measurement device according to this aspect of the invention is in this case the position of the image on the surface of the substrate. By establishing the lateral position of the image of the mask structures, more precise correction measures during exposure are made possible, and as a result the quality of the image produced on the substrate is increased.

In a further embodiment according to the invention the measurement structure is disposed on the mask side and the detector is disposed on the substrate side in relation to the projection optics. Alternatively, the arrangement can also be reversed, i.e. the measurement structure can in this case be disposed on the substrate side and the detector on the mask side. Advantageously, the measurement structures and the detector are disposed in planes which are conjugated to the mask plane or to the substrate plane. In an alternative embodiment both elements can be disposed in other sharpness planes conjugated to one another.

In a further embodiment of the version according to the invention wherein the measurement structure is disposed on the mask side and the detector is disposed on the substrate side, the mask holding device forms part of a mask table and the reference element is the reference frame of the mask table. The measurement structure disposed on the reference element thus remains static in relation to the movement of the mask during exposure in the case of a so-called "scanner". The reference frame of the mask table is substantially stationary to the projection optics. The reference frame can be securely connected to the projection optics here or also be coupled to the latter by vibration isolation. In the version in which the measurement structure is disposed on the substrate side and the detector on the mask side, the substrate holding device advantageously forms part of a substrate table, and the reference element is the reference frame of the substrate table.

In a further embodiment according to the invention the substrate holding device is mounted moveably in relation to the detector. As already mentioned above the projection exposure system may have a second reference element, in relation to which the substrate holding device is mounted moveably. In one embodiment this second reference element can be the reference frame of a substrate table or of a so-called "wafer stage" which also comprises the substrate holding device.

In a further embodiment according to the invention both the measurement structure and the detector are disposed on one side of the projection optics and a reflective element is disposed on the other side of the projection optics such that the radiation produced by the measurement structure is reflected back by the reflective element into the projection optics after passing through the projection optics for the first time and strikes the detector after passing through the projection optics for a second time. In this configuration the available space required on the substrate side for the measurement device can be kept small.

In a further embodiment according to the invention the projection exposure system, in particular the above mentioned measurement device, has at least a second detector for recording an image of a second measurement structure produced by imaging with the projection optics on the second detector, the projection exposure system being configured such that the electromagnetic radiation producing the image of the second measurement structure passes through a different optical path through the projection optics than the electromagnetic radiation producing the image of the first measurement structure. In particular, the optical paths are configured such that the image of the first measurement structure and the image of the second measurement structure are disposed at different positions in relation to the field imaged on the substrate. Therefore, the imaging characteristics of the projection optics can be established both with regard to lateral movement and to rotation of the imaged structures. In one embodiment according to the invention both the first detector and the second detector are configured to measure the imaging characteristics of the projection optics with regard to lateral movement in the x and y direction.

In a further embodiment according to the invention the measurement structure respectively has two alternately disposed first and second structure elements, the first structure elements causing a higher light intensity in their imaging onto the detector than the second structure elements. The first structure elements can also be identified as so-called bright structure elements. On the detector they lead to bright regions in contrast to the second "dark" structure elements which lead to corresponding dark regions on the detector. In comparison with the dark structure elements the bright structure elements can e.g. have a higher transmission capability if the measurement structure is in the form of a transmission mask or higher reflectivity if the measurement structure is in the form of a reflection mask. Since the measurement structure respectively has two alternately disposed first and second structure elements of the aforementioned type, the measurement structure is in the form of a "pattern" in contrast to a punctiform measurement structure. Due to the design of the measurement structure as a "pattern", the position of the image of the measurement structure on the detector can be established with greater accuracy in comparison to a punctiform design of the measurement structure.

In a further embodiment according to the invention the measurement structure has a periodic structure, in particular a grating structure. Therefore, the measurement structure comprises periodically alternately disposed first and second structure elements. The embodiment of the measurement structure as a periodic structure enables particularly accurate determination of the position of the image of the measurement structure on the detector. In further embodiments according to the invention the measurement structure has combined gratings, dot patterns, chequer-board patterns, non-periodic lines and/or patterns with different line thicknesses and spacing encodings. Furthermore, the measurement structure with the embodiment as a grating structure can have a spatial variation of the grating spacing, a spatial variation of the line width and/or a variation of the directions of the lines. In a further embodiment separate patterns for x and y position measurement are implemented in the measurement structure, or the measurement patterns are deftly combined for the two co-ordinate directions.

In a further embodiment according to the invention the detector has a locally resolving two-dimensional sensor and a detector structure disposed in front of the two-dimensional sensor, in particular in the form of a detector grating, and the detector is set up to record the image produced on the detector by imaging with the projection optics by the detector recording a pattern produced by superimposing the image of the measurement structure with the detector structure. By superimposing the measurement structure, which is also advantageously in the form of a grating, with the detector structure, the position can be determined particularly accurately. The measurement structure and the detector structure can respectively be formed with the structures mentioned above, but are advantageously correspondingly adapted to one another.

In a further embodiment according to the invention the measurement structure has a measurement grating and the detector has a locally resolving two-dimensional sensor and a detector grating disposed in front of the two-dimensional sensor, the detector grating being adapted to the measurement grating such that a relative movement of the gratings in relation to one another can be measured using the Moiré measurement method. The Moiré measurement method, which is basically known to the person skilled in the art, utilises the Moiré effect with which long-period brightness modulations are produced by superimposing two line gratings the grating constants of which only slightly deviate from one another. By evaluating the pattern produced a relative movement of the two gratings in relation to one another can be established with a high degree of precision. The evaluation device according to one aspect of the invention advantageously implements the Moiré evaluation with the two-dimensional intensity pattern established using the locally resolving two-dimensional sensor. The detector grating is advantageously adapted to the measurement grating such that the period of the measurement grating when imaging onto the detector grating slightly differs from the period of the detector grating.

In a further embodiment according to the invention the detector grating comprises n partial gratings, n being at least two, and advantageously at least four, the periods of the partial gratings respectively corresponding to the period of the measurement grating, and adjacent partial gratings respectively being disposed with a period offset in relation to one another by an nth of the period of the measurement grating. By using partial gratings with a constant period, at n different measurement points with different phase displacement the respective signal can be recorded with a relatively large detector measurement surface without signal washout. In contrast to the measurement method with which the measurement and the detector gratings have different grating constants and so a specific phase displacement is only present at discreet points, when using partial gratings the same phase displacement is respectively present for the whole partial grating. Therefore, by using the partial gratings for each measurement point the Moiré pattern can be measured over an extended detector area, and so the contrast of the measurement signal can be increased. The period of the Moiré pattern can then be established from the measurement signals measured at the n measurement points. The detector grating may only comprise two partial gratings if there are restrictions in the catch range. When using at least four partial gratings these restrictions are not necessary. If two spatial directions are to be measured, advantageously two detector gratings are provided.

In a further embodiment according to the invention the mask is in the form of a reflection mask and the projection exposure system is configured to image the reflection mask onto the substrate. In particular, the projection exposure system comprises the reflection mask. By using a reflection mask a measurement structure which is also designed to be reflective can be introduced into the optical path of the radiation source illuminating the mask such that the mask illumination radiation can also be used for imaging the measurement structure without a region for the passage of the radiation used for the imaging of the measurement structure having to be kept free on the mask. In the case where the mask is in the form of a transmission mask and the illumination radiation of the mask is also to be used for imaging the measurement structure, the illumination radiation used for imaging the measurement structure must advantageously first of all pass through the mask. For this purpose a region on the mask must be kept free for the passage of this radiation, and this reduces the mask surface usable for imaging the mask structures. However, the embodiment of the mask as a reflection mask enables implementation of the method according to this aspect of the invention without losing any useable mask surface.

In a further embodiment according to the invention the projection optics only comprise reflective optical elements and mirrors. A change in the position or location of each individual reflective optical element leads to a movement of the lateral position of the image both of the measurement structure and of the mask structures. The measurement according to this aspect of the invention of the lateral image position during exposure makes it possible with such projection optics to improve the image quality to a particular degree.

In a further embodiment according to the invention the projection exposure system is configured as a so-called "scanner". The person skilled in the art understands a "scanner" as being a projection exposure system wherein during the exposure of a field both the mask and the substrate are continually moved in relation to the projection optics. These systems are also known as so-called "step and scan" exposure systems.

In a further embodiment according to the invention the projection exposure system furthermore has a radiation source for illuminating the mask with illumination radiation, both the mask and the measurement structure being illuminated with the same illumination radiation. This illumination radiation has in particular a wavelength in the EUV wavelength range or wavelength range of higher frequency.

In a further embodiment according to the invention the projection exposure system has a first radiation source for illuminating the mask with illumination radiation of a first wavelength, in particular in the EUV wavelength range, and a second radiation source for illuminating the measurement structure with illumination radiation of a second wavelength, the second wavelength being in the wavelength range of 120 nm to 1100 nm, and in particular 365 nm. The first wavelength differs from the second wavelength. The illumination radiation of the first wavelength does not have the second wavelength, and conversely the illumination radiation of the second wavelength does not have the first wavelength. When using illumination radiation in the UV wavelength range the measurement structure can be recorded by detectors developed for the UV range. A resolution improvement can be brought about by reducing the aerial image period by reducing the k1 factor, e.g. through oblique illumination.

In a further embodiment according to the invention the projection exposure system has a vacuum chamber in which the imaging of the mask structures onto the substrate takes place using the illumination radiation of the first wavelength in the EUV wavelength range, and wherein the measurement structure is disposed within the vacuum chamber. Advantageously, the illumination radiation produced by the second radiation source is directed into the vacuum chamber by an optical fiber and strikes the measurement structure here.

In a further embodiment according to the invention the illumination radiation of the second wavelength is directed by a prism or mirror into the optical path of the projection optics.

In a further embodiment according to the invention a mask table comprising the mask holding device, the reference element in the form of a mask table reference frame and the measurement structure, the projection optics and a substrate table comprising the substrate holding device, a substrate table reference frame and the detector move mechanically freely in relation to one another during exposure. A control signal is established for a positioning device from the established lateral position of the image of the measurement structure on the detector, the positioning device changes the position of at least one element of the projection exposure system during the exposure process upon the basis of the control signal such that the movements between the mask table, the projection optics and the substrate table are thus compensated in their effect upon the lateral position of the image of the measurement structure on the detector.

Furthermore, according to another aspect of the invention a projection exposure system for microlithography, in particular according to any of the preceding projection exposure systems, is provided comprising: a mask holding device for holding a reflection mask with mask structures disposed on the latter, projection optics for imaging the mask structures onto a substrate, a radiation source which is configured to produce an illumination beam radiated obliquely onto the reflection mask so that the propagation direction of a reflected beam produced by reflection of the illumination beam on the reflection mask and directed towards the projection optics is tilted in relation to the opposite propagation direction of the illumination beam, and a diverting device for diverting a measurement beam from the illumination beam. The diverting device comprises: a coupling/uncoupling device and a measurement mirror having a measurement structure, the coupling/uncoupling device and the measurement mirror being disposed in the optical path of the illumination beam such that during operation of the projection exposure system a partial beam of the illumination beam is directed from the coupling/uncoupling device onto the measurement structure of the measurement mirror, from here is reflected back onto the coupling/uncoupling device, and by the latter is coupled as the measurement beam into the optical path of the beam reflected by the reflection mask. Advantageously the coupled partial beam has the same propagation direction as the reflected beam. The coupling/uncoupling device can only be designed in the form of a mirror or also comprise two individual mirrors, one for uncoupling the partial beam from the illumination beam, and one for coupling the measurement beam into the optical path of the reflected beam.

Furthermore, according to a further aspect of the invention a method is provided for determining a property of an image produced on a substrate, in particular according to any of the aforementioned embodiments of the method for determining the lateral position of an image produced on a substrate by a projection exposure system. The method according to this aspect of the invention comprises: holding a reflection mask with mask structures disposed on the latter, producing an illumination beam with a radiation source and radiating the illumination beam onto the reflection mask obliquely so that by reflection of the illumination beam on the reflection mask a reflected beam is produced which is tilted in relation to the opposite propagation direction of the illumination beam, and diverting a measurement beam from the illumination beam by disposing a coupling/uncoupling device and a measurement mirror in the optical path of the illumination beam such that a partial beam of the illumination beam is reflected back by the coupling/uncoupling device and is coupled by the latter as the measurement beam into the optical path of the beam reflected by the reflection mask. Advantageously the partial beam is coupled by the coupling/uncoupling device into the optical path of the beam reflected by the reflection mask such that the coupled partial beam has the same propagation direction as the reflected beam.

The diverting device according to this aspect of the invention makes it possible to image the measuring structure onto a detector with the same radiation as the mask structures onto the substrate. By using the same radiation a particularly precise correlation between the imaging of the measurement structure and the imaging of the mask structures can be produced. Furthermore, the diverting device according to this aspect of the invention makes it possible to divert the measurement beam without having any negative impact upon the imaging of the measurement structures, and in particular without any necessity for keeping regions on the mask for the imaging of the measurement structure. The use of the illumination radiation used for the imaging of the mask structures also for the imaging of the measurement structure makes it possible to determine a position deviation of the image of the measurement structure on the detector with comparable precision with which the mask structures are also printed onto the substrate. The diverting device according to this aspect of the invention therefore enables particularly precise determination of the lateral position of the image of the mask structures produced on the substrate, through which smearing of the latent image of the mask structures in the photoresist is largely prevented.

In a further embodiment of the projection exposure system and of the method according to the invention the wavelength of the illumination beam is in the EUV and/or higher frequency wavelength range.

In a further embodiment according to the invention the diverting device is configured such that the optical path length for the radiation of the partial beam diverted from the illumination beam by the coupling/uncoupling device up to entry as a measurement beam into the optical path of the reflected beam deviates by maximum 0.5 mm from the optical path length which the electromagnetic radiation of the partial beam of the illumination beam not diverted by the coupling/uncoupling device has passed through up to entry of the measurement beam into the reflected beam. In particular, both optical path lengths are identical. The imaging of the measurement structure onto the detector is therefore associated with the same image errors as the imaging of the mask structures onto the substrate. This makes possible a particularly precise correlation between the detector measurement and the lateral movement of the image of the mask structures. Advantageously, the projection optics are optimised with regard to the imaging of the mask structures in relation to imaging errors, in particular spherical aberrations. According to the embodiment mentioned above, the imaging of the measurement structure onto the detector is also optimised with regard to imaging errors that occur.

In a further embodiment according to the invention the projection exposure system has a measurement device for monitoring an imaging property of the projection optics, the measurement device comprising: the diverting device, a detector for recording an image of the measurement structure which is produced by the measurement beam on the detector after the latter has passed through the projection optics, and an evaluation device which is configured to establish the imaging property of the projection optics from the image of the measurement structure recorded by the detector. The imaging property determined by the measurement device is in particular the lateral imaging property described above.

In a further embodiment according to the invention the measurement structure and the detector are disposed such that during operation of the projection exposure system the imaging of the mask structures onto the substrate and the imaging of the measurement structure onto the detector take place at the same time respectively with the projection optics. In a further embodiment according to the invention the evaluation device is configured to establish a radiation intensity from the image of the measurement structure recorded by the detector and to control the dose of radiation provided by the radiation source with the radiation intensity established. It is therefore possible to dispose the diverting device in the region of the reflected useful beam used for imaging the mask structures onto the substrate and which is usually used for dose control of the projection exposure system. Therefore the same beam region is available for imaging the mask structures onto the substrate as with conventional projection exposure systems.

In a further embodiment according to the invention the coupling/uncoupling device is disposed such that the partial beam directed onto the measurement structure by the coupling/uncoupling device is tilted in relation to the plane which is spanned by the propagation vector of the illumination beam and the propagation vector of the tilted reflected beam such that the measurement mirror is disposed outside of the optical path of the beam reflected by the reflection mask. In particular, the coupling/uncoupling device is disposed such that the optical path of the uncoupled partial beam between the coupling/uncoupling device and the measurement mirror is tilted in relation to the optical axis of the projection optics. In a further embodiment according to the invention the measurement mirror is disposed outside of the optical path of the beam reflected by the reflection mask projected along the spanned plane.

In a further embodiment according to the invention the measurement mirror is disposed outside of the optical path of the beam reflected by the reflection mask. This makes it possible to take the measurement of the lateral position of the imaged measurement structure without having any negative impact upon the imaging of the mask structures.

In a further embodiment according to the invention the projection exposure system has a reference element opposite which the mask holding device is moveably mounted and on which the diverting device is disposed. This reference element can in particular be the reference frame of a mask table.

In a further embodiment of the projection exposure system having the diverting device the evaluation device is configured to establish the lateral position of the image of the measurement structure produced on the recording surface of the detector during the exposure process in real time. In a further embodiment according to the invention the evaluation device is configured to identify a change to the lateral position of the image occurring over the temporal progression from the lateral position of the image of the measurement structure on the detector established in real time, and furthermore the projection exposure system has a positioning device which is configured to change the position of an element of the projection exposure system, in particular the mask holding device, the substrate holding device and/or an optical element of the projection optics in order to correct the lateral position of the image of the measurement structure on the detector.

In a further embodiment according to the invention the projection exposure system having the diverting device is configured to image the mask structures with light in the EUV and/or higher frequency wavelength range onto the substrate. In a further embodiment according to the invention the evaluation device is configured to establish the lateral position of the image of the mask structures produced on the detector from the image of the measurement structure recorded by the detector. In a further embodiment according to the invention of the projection exposure system having the diverting device the mask holding device forms part of a mask table and the reference element is the reference frame of the mask table. Furthermore, it is advantageous if the substrate holding device is mounted moveably in relation to the detector. In a further embodiment according to the invention of the projection exposure system having the diverting device the measurement device has at least a second detector for recording an image of a second measurement structure produced by imaging with the projection optics on the second detector, the projection exposure system being configured such that the electromagnetic radiation producing the image of the second measurement structure passes through a different optical path through the projection optics than the electromagnetic radiation producing the image of the first measurement structure.

In a further embodiment according to the invention of the projection exposure system having the diverting device the measurement structure respectively has two alternately disposed first and second structure elements, the first structure elements causing a higher light intensity in their imaging onto the detector than the second structure elements. In a further embodiment according to the invention the measurement structure has a periodic structure, in particular a grating structure. In a further embodiment according to the invention the detector has a locally resolving two-dimensional sensor and a detector structure disposed in front of the two-dimensional sensor, and the detector is set up to record the image produced on the detector by imaging with the projection optics by the detector recording a pattern produced by superimposing the image of the measurement structure with the detector structure. In a further embodiment according to the invention of the projection exposure system having the diverting device the measurement structure has a measurement grating and the detector has a locally resolving two-dimensional sensor and a detector grating disposed in front of the two-dimensional sensor, the detector grating being adapted to the measurement grating such that a relative movement of the gratings in relation to one another can be measured using the Moiré measurement method. In a further embodiment according to the invention the detector grating comprises n partial gratings, n being at least two, and advantageously at least four, the periods of the partial gratings respectively corresponding to the period of the measurement grating, and adjacent partial gratings being disposed respectively with a period offset in relation to one another by an nth of the period of the measurement grating. In a further embodiment according to the invention the mask is in the form of a reflection mask and the projection exposure system is configured to image the reflection mask onto the substrate.

In a further embodiment according to the invention of the projection exposure system having the diverting device, the projection optics only comprise reflective optical elements or mirrors. In a further embodiment according to the invention the projection exposure system is configured as a so-called "scanner". In a further embodiment according to the invention the projection exposure system furthermore has a radiation source for illuminating the mask with illumination radiation, both the mask and the measurement structure being illuminated with the same illumination radiation. In a further embodiment according to the invention the projection exposure system has a first radiation source for illuminating the mask with illumination radiation of a first wavelength, in particular in the EUV wavelength range, and a second radiation source for illuminating the measurement structure with illumination radiation of a second wavelength, the second wavelength being in the wavelength range of 120 nm to 1100 nm, and in particular 365 nm. In a further embodiment according to the invention the projection exposure system has a vacuum chamber in which the imaging of the mask structures onto the substrate takes place using the illumination radiation of the first wavelength in the EUV wavelength range, and wherein the measurement structure is disposed within the vacuum chamber. In a further embodiment the illumination radiation of the second wavelength is directed by a prism or mirror into the optical path of the projection optics.

In one embodiment of the method according to the invention the mask structures are imaged onto the substrate with light in the EUV and/or higher frequency wavelength range. In a further embodiment according to the invention the lateral position of the image of the measurement structure produced on the detector is established during the exposure process in real time. In a further embodiment according to the invention an image of the second measurement structure is produced by imaging with the projection optics on a second detector, and the electromagnetic radiation producing the second image passes through a different optical path through the projection optics than the electromagnetic radiation producing the first image. In the further embodiment according to the invention the detector has a locally resolving two-dimensional sensor and a detector grating disposed in front of the two-dimensional sensor, and the recording of the image of the measurement structure takes place using the detector by the pattern produced by superimposing the measurement structure with the detector grating being recorded by the detector. In a further embodiment according to the invention when establishing the position of the image of the measurement structure produced on the detector a relative movement between the image of the measurement structure and the detector is established using the Moiré measurement method. In a further embodiment the mask is moved in relation to the projection optics during imaging of the mask structures onto the substrate.

According to another aspect of the invention further a projection exposure system for microlithography is provided. The projection exposure system comprises a mask holding device for holding a mask with mask structures disposed on the latter, the mask holding device being mounted moveably in relation to a reference element of the projection exposure system, a substrate holding device for holding a substrate, projection optics for imaging the mask structures onto the substrate during an exposure process, and a measurement device for monitoring the lateral imaging stability of the projection optics during the exposure process, the measurement device comprising: a measurement structure which is disposed on the reference element in a fixed position, and a detector having a recording surface for recording an image of the measurement structure produced by imaging with the projection optics on the detector, the measurement structure and the detector being disposed such that during operation of the projection exposure system the imaging of the mask structures onto the substrate and the imaging of the measurement structure onto the detector take place at the same time respectively with the projection optics, and the measurement device further comprising an evaluation device which is configured to establish a lateral position of the image of the measurement structure on the recording surface of the detector during the exposure process.

According to a further aspect of the invention a method for monitoring the lateral imaging stability of projection optics of a projection exposure system for microlithography is provided. The method comprises: holding a mask with mask structures disposed on the latter by a mask holding device, which is moveably mounted in relation to a reference element of the projection exposure system, a measurement structure being disposed in a fixed position on the reference element, imaging the mask structures onto a substrate in an exposure process and imaging the measurement structure onto a recording surface of a detector, the imaging of the mask structures and the imaging of the measurement structure respectively taking place at the same time with projection optics of the projection exposure system, recording the image of the measurement structure by the detector, and establishing a lateral position of the image of the measurement structure on the recording surface of the detector during the exposure process.

The features specified in relation to the above-specified embodiments of the projection exposure system according to the invention can be correspondingly applied to the method according to the invention. The resulting embodiments of the method according to the invention are to be explicitly included by the disclosure of the invention. Furthermore, the above-specified advantages in relation to the embodiments of the projection exposure system according to the invention therefore also relate to the corresponding embodiments of the method according to the invention. These and other features of specified embodiments of the invention are described in the claims as well as in the specification and the drawings. The individual features may be implemented either alone or in combination as embodiments of the invention, or may be implemented in other fields of application. Further, they may represent advantageous embodiments that are protectable in their own right, for which protection is claimed in the application as filed or for which protection will be claimed during pendency of this application and/or continuing applications.

BRIEF DESCRIPTION OF THE DRAWINGS

In the following exemplary embodiments of the projection exposure system according to the invention and of the method according to the invention are described in greater detail with reference to the attached schematic drawings. These show as follows.

DETAILED DESCRIPTION OF EXEMPLARY EMBODIMENTS ACCORDING TO THE INVENTION

In the exemplary embodiments described below, elements which are functionally or structurally similar to one another are provided as far as possible with the same or similar reference numbers. Therefore, in order to understand the features of the individual elements of a specific exemplary embodiment, reference should be made to the description of other exemplary embodiments or the general description of the invention.

Figure 1:
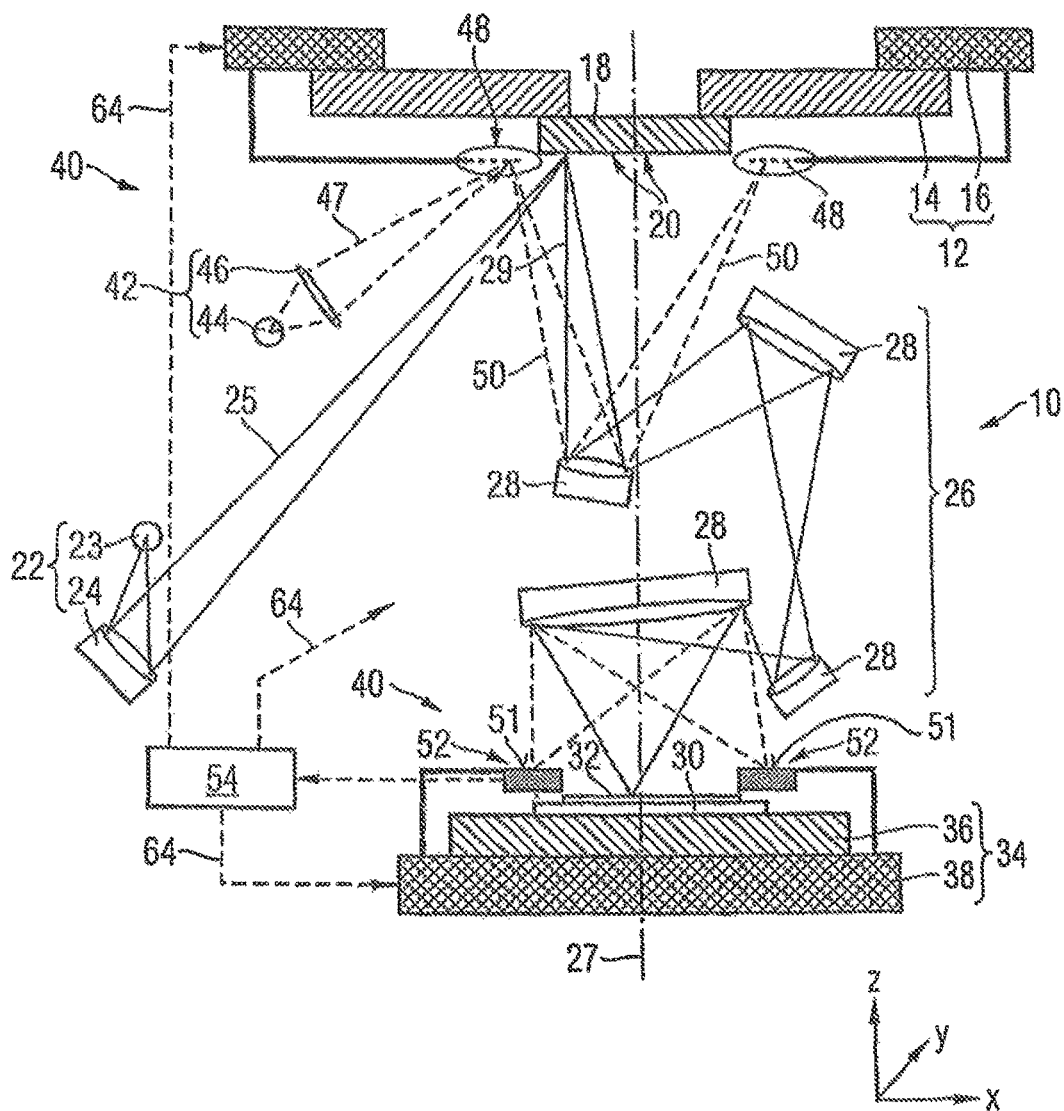
FIG. 1 a schematised sectional view of a first embodiment of a projection exposure system according to the invention with a measurement device for determining the lateral position of an image of mask structures produced on a substrate, FIG. 2 a strongly schematised view of individual elements of the projection exposure system according to FIG. 1, FIG. 3 an illustration of the mode of operation of the measurement device according to FIG. 1, FIG. 4 a section on the mask side of a further embodiment according to the invention of the projection exposure system shown in FIG. 1, FIG. 5 a section on the substrate side of the projection exposure system according to FIG. 4, FIG. 6 an illustration of a first embodiment of the evaluation of a measurement structure imaged onto a detector of the measurement device, FIG. 7 an illustration of a second embodiment of the evaluation of a measurement structure imaged on a detector of the measurement device, FIG. 8 a first view of a section on the mask side of a further embodiment of a projection exposure system according to the invention, FIG. 9 a further view, rotated about 90° in relation to the first view according to FIG. 8, of the mask side section of the projection exposure system according to FIG. 8, FIG. 10 a section on the substrate side of the projection exposure system illustrated in FIG. 8, FIG. 11 a top view of an exposure strip in the substrate plane, FIG. 12 a schematised sectional view of a further embodiment of a projection exposure system according to the invention, FIG. 13 a schematised sectional view of a further embodiment of a projection exposure system according to the invention, FIG. 14 a schematized sectional view of a further embodiment of a projection exposure system according to the invention, FIG. 15 a schematized sectional view of a further embodiment of a projection exposure system according to the invention, FIG. 16 a portion of projection optics according to the invention comprising an optical element mounted moveably to a frame of the projection optics, FIG. 17 a substrate holding device according to the invention configured to correct image deviations, and FIG. 18 a schematized sectional view of a further embodiment of a projection exposure system according to the invention configured to be triggered on a measurement signal identifying lateral image deviations.
Figure 2:
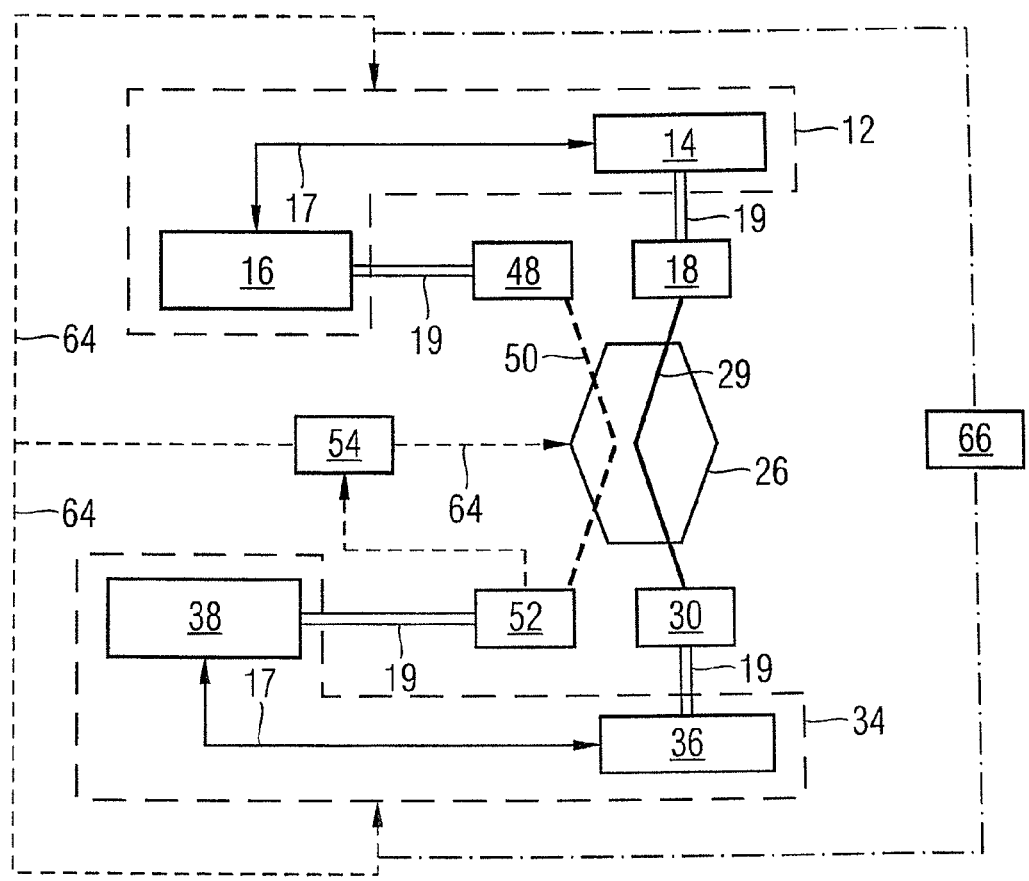

FIG. 1 illustrates a first embodiment of a projection exposure system 10 according to the invention in the form of an EUV projection exposure system designed as a so-called "scanner". FIG. 2 schematically shows individual elements of the projection exposure system 10 according to FIG. 1 in order to illustrate mechanical couplings of the individual elements to one another. In FIG. 2 mechanically rigid measures between individual elements are shown by continuous double lines 19. Mountings of individual elements which are moveable in relation to one another are illustrated by continuous lines 17 having arrows at both ends. The projection exposure system 10 comprises a mask table 12 which is also identified as a so-called "reticle stage". The mask table 12 comprises a mask holding device 14 for holding a mask 18 in the form of a reflective mask or reflection mask. The mask holding device is moveably disposed on a reference frame 16 of the mask table 12 in the x/y plane according to FIG. 1, but overall is adjustable in six degrees of freedom. The moveable mounting of the mask holding device 14 in relation to the reference frame 16 is illustrated in FIG. 2 by the line 17.

The mask 18 has on its lower surface mask structures 20 for imaging onto a substrate 30 in the form of a wafer coated with photoresist 32. The projection exposure system 10 comprises a first illumination system 22 with a first radiation source 23 in the form of an EUV radiation source in order to produce extreme ultraviolet radiation with a wavelength of 13.5 nm. Furthermore, the first illumination system 22 comprises beam-forming illumination optics 24 in the form of a reflective element with which an illumination beam 25 is directed towards the mask 18. Furthermore, the projection exposure system 10 comprises projection optics 26 with an optical axis 27 aligned perpendicularly to the mask 18. The projection optics 26 comprise a series of reflective optical elements 28. Four optical elements 28 of this type are illustrated by way of example in FIG. 1.

Furthermore, in FIG. 1 an optical path 29 of the electromagnetic radiation passing through the projection optics 26 during imaging of the mask structures 20 is shown. The substrate 30 is disposed on a substrate table 34 in the form of a so-called "wafer stage". The substrate table 34 comprises a substrate holding device 36 for holding the substrate 30 and a reference element in the form of a reference frame 38 opposite which the substrate holding device 36 is disposed moveably.

When exposing the substrate 30 both the mask holding device 14 and the substrate holding device 36 are moved and "scanned" in order to produce a field on the substrate 30. The movement is generally made in the short direction of the field, i.e. in the y direction according to FIG. 1. Before exposing a further field the substrate 30 is offset by a pre-specified distance in the x/y plane between the fields.

The projection exposure system 10 further comprises a measurement device 40 for determining the lateral position of the image of the mask structures 20 produced by the imaging of the mask structures 20 on the substrate 30. The measurement device 40 comprises a measurement structure 48 and a second illumination system 42 for illuminating the measurement structure 48. The second illumination system 42 comprises a second radiation source 44 which emits electromagnetic radiation in the visible or ultraviolet wavelength range, e.g. with a wavelength of 193 nm, 248 nm or 365 nm. The illumination system 42 further comprises illumination optics 46 in the form of transmission optics for directing the radiation produced by the radiation source 44 as a measurement illumination beam 47 onto two measurement structures 48. As stated in the following, the projection exposure system 10 in a further embodiment can also have just a single radiation source with which both the mask structures 20 and the measurement structures 48 are illuminated.

The measurement structures 48 according to FIG. 1 are designed in the form of a reflection grating, and are disposed in a fixed position on the reference element in the form of a reference frame 16 of the mask table 12, respectively close to opposing peripheral regions of the mask 18. This arrangement in a fixed position is illustrated by the double line 19 in FIG. 2. Therefore, the measurement structures 48 do not move with the mask 18 during the scanning process during exposure of a field. They substantially remain in a fixed position in relation to the projection optics 26 in relation to which the reference frame is coupled to a vibration isolation device. The respective optical paths 50 of the radiation which passes through the projection optics 26 in order to image the measurement structures 48 onto the respective detectors 52 disposed on the substrate side, are partially illustrated in FIG. 1 with broken lines. The detectors 52 are disposed in a fixed position close to two opposing peripheral regions of the substrate 30 on the reference frame 38 of the substrate table 34, as illustrated by the double line 19 according to FIG. 2. Therefore, like the measurement structures 48, the detectors 52 also do not move during the scanning process during exposure of a field. The detectors 52 remain substantially in a fixed position in relation to the projection optics 26 and in relation to the measurement structures 48, but do not have to be connected rigidly to these elements. The reference frame 38 of the substrate table 34 can be coupled to the projection optics 26 by a vibration isolation device. The reference frame 38 can move slowly in relation to the projection optics 26 together with the substrate holding device 36. The measurement device 40 compensates this type of movement. As shown in FIG. 2, the reference frame 16 of the mask table 12 does not have to be connected rigidly to the reference frame 38 of the substrate table 34. Neither the reference frame 16 nor the reference frame 38 are necessarily connected to the projection optics 26 either. In the embodiment shown the reference frames 16 and 38 can rather move in relation to one another and to the projection optics 26. There is no negative impact upon the function of the measurement device 40 due to this.

The electromagnetic radiation producing the image of a first of the two measurement structures 48 passes through a different optical path 50 through the projection optics 26 than the electromagnetic radiation producing the image of the second of the measurement structures 48. The image of the first measurement structure 48 is imaged onto a recording surface 51 of a first of the detectors 52, and the image of a second measurement structure 48 onto a recording surface 51 of the second detector 52. Using the first and the second detector 52 the lateral position of the image in the x and y direction is respectively determined, as explained in greater detail below.

Figure 3:
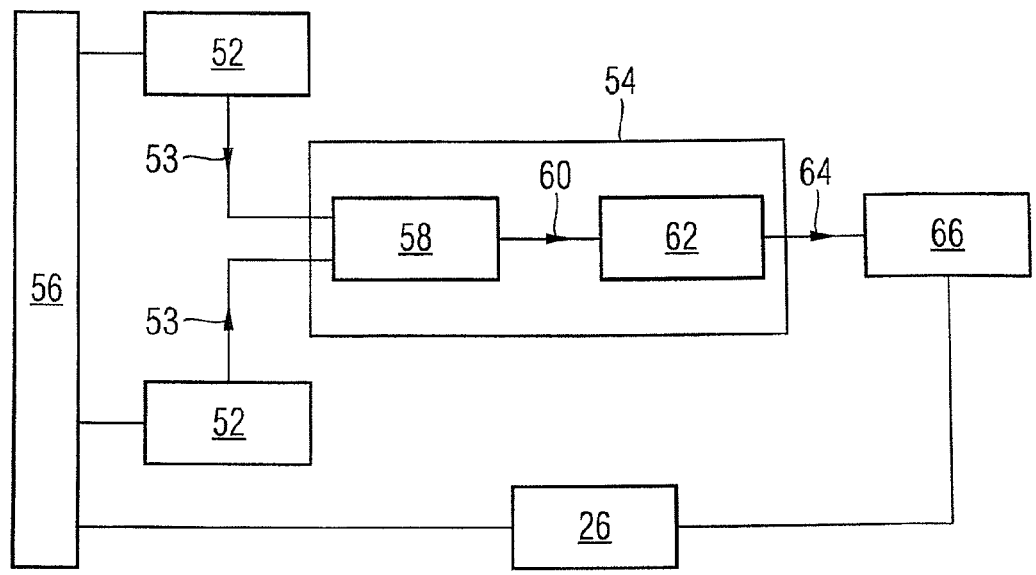

The projection exposure system 10 further has an evaluation device 54 which is configured to establish during the exposure process the lateral position of the image of the measurement structures 48 on the recording surface 51 of the detectors 52 from the images of the respective measurement structures 48 recorded by the detectors 52. As illustrated in FIG. 3, respective x/y movements 53 of the images of the respective measurement structure 48 produced at two peripheral positions of the image field 56 on the substrate 30 in relation to a desired position of the latter are determined with the two detectors 52. These movement values 53 are evaluated by a calculation unit 58 of the evaluation device to establish a lateral image position 60, defined by the image position and the image rotation. In other words, the calculation unit 58 determines on the one hand the movement of the image field perpendicularly to the optical axis 27 and also the rotation of the image field about the optical axis 27.

The measurement device 40 as a whole can also be identified as a so-called "line of sight sensor". A positioning signal production unit 62, also referred to as control device, of the evaluation device 54 takes into account the sensitivities of the projection optics, establishes a positioning signal 64 from the deviation of the image field 56 during the scanning movement of the exposure process and transmits the positioning signal 64 to an element of the projection exposure system 10. In FIG. 3 a scanning control device 66 which controls the movement of the mask table 12 and of the substrate table 34 is shown as an example of this type of element of the projection exposure system 10 receiving the positioning signal 64. Alternatively, or in addition, the positioning signal 64 can also be used to change the position of at least one of the reflective optical elements 28 of the projection optics 26, as illustrated in FIG. 1.

The effect of the positioning signal 64 is that the respective lateral image position of the measurement structures 48 measured by the detectors 52 and so as a good approximation also the lateral image position of the mask structures 20 on the substrate 30 remains constant during the whole exposure process. A change to the movement sequence of the mask table 12 and/or of the substrate table 34 brought about by the positioning signal 64 during the exposure of the substrate 30 and the change in the position of one or more optical elements 28 produces with the imaging by the projection optics 26 a back coupling to the positions of the image positions in the field 56 measured by the detectors 52.

During operation of the projection exposure system according to FIG. 1 the imaging of the mask structures 20 onto the substrate 30 and the imaging of the measurement structures 48 onto the assigned detectors 52 takes place at the same time. This means that the lateral image position is established during exposure of the substrate 30 in real time. The correction using the positioning signal 64 therefore also takes place in real time, i.e. during exposure of a field with which the scanning movement of the mask 18 and of the substrate 30 described above takes place.

In other words, a measure for the actual position of the image field produced online by the projection optics 26 is measured with a very high degree of precision and a very high repetition frequency during exposure of the photoresist 32 and is kept stable with corresponding control on the substrate 30. The measurement structures 48 and the detectors 52 according to FIG. 1 are located in planes which are conjugated to the mask plane and to the substrate plane. Alternatively, the two elements can also be disposed in other sharpness planes conjugated to one another.

Figure 4:
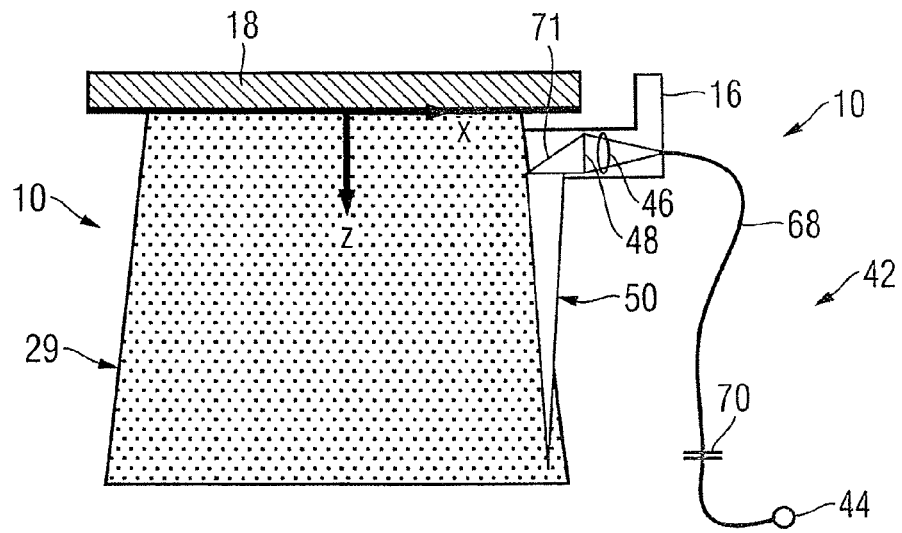
Figure 5:
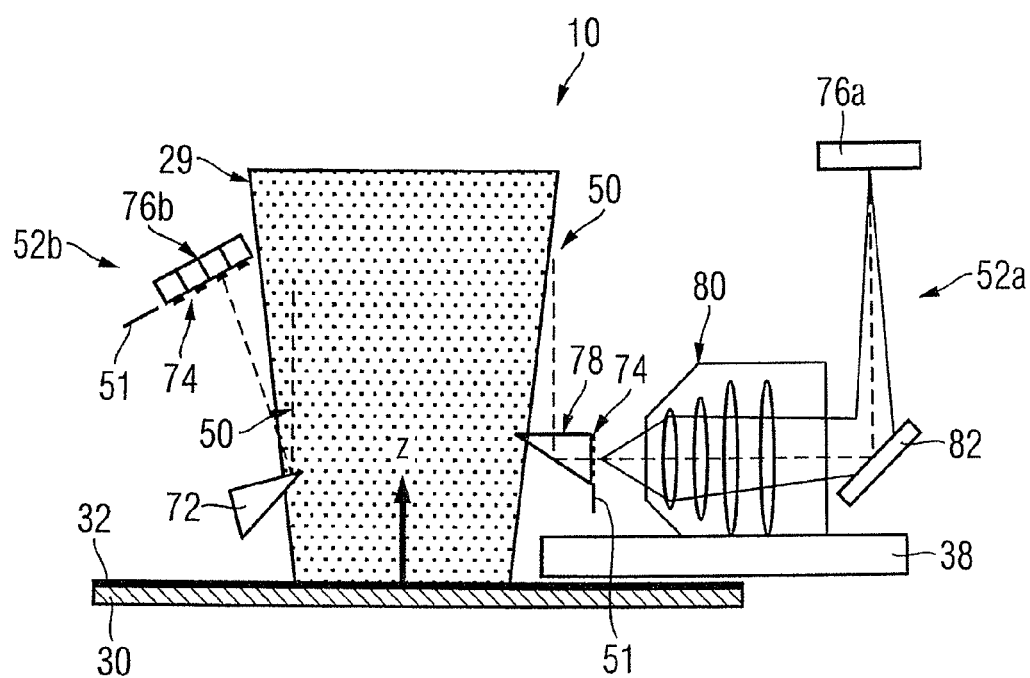

FIGS. 4 and 5 show a section on the mask side and a section on the substrate side of a further embodiment of a projection exposure system according to the invention 10. This only differs from the projection exposure system 10 according to FIG. 1 in the elements shown differently in FIGS. 4 and 5 and the elements described below. The second illumination system 42 shown in FIG. 4 comprises in addition to the second radiation source 44 an optical fiber 68 which has a vacuum breaker 70. The radiation of the radiation source 44 with a wavelength in the visible or near UV range is introduced into a vacuum chamber by the optical fiber 68. The whole optical path 29 for the EUV radiation used for imaging the mask structures 20 is located in the vacuum chamber.

The radiation provided by the optical fiber 68 is directed with the illumination optics 46 onto the measurement structure 48 in the form of a grating. The measurement radiation passing through the measurement structure 48 is deflected by a beam deflection device 71, e.g. in the form of a prism or mirror, into the optical path 50. The illumination optics 46, the measurement structure 48 and the beam deflection device 71 are located within the vacuum chamber. Detection of the measurement beam on the substrate side can either be implemented by the detector 52a shown on the right-hand side of the optical path 29 in FIG. 5 or by the detector 52b shown on the left-hand side of the optical path 29 in FIG. 5.

With the detector 52a the measurement radiation 50 is directed by a prism 78 onto a detector grating 74. The superposition of the image of the grating structure of the measurement structure 48 with the detector grating 74, which is described in detail below, is directed by a microscope lens 80 and a deflection mirror 82 onto a locally resolving two-dimensional sensor 76a in the form of a CCD camera. With the detector 52b shown in FIG. 5 on the left-hand side in relation to the optical path 29, the measurement radiation 50 is directed by a mirror 72 in the form of a multilayer mirror onto an also locally resolving two-dimensional sensor 76b in the form of a multi-element intensity sensor with a detector grating 74 disposed on the recording surface of the sensor 76b.

Figure 6:
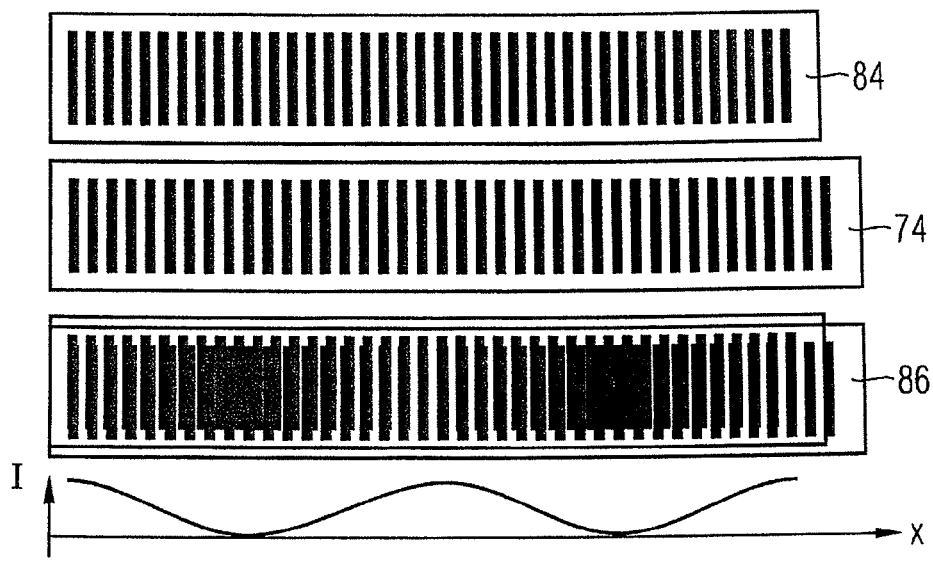

The grating of the measurement structure 48, which in the following is called the measurement grating 48, and the detector grating 74 are adapted to one another such that a relative movement of the gratings in relation to one another can be measured in one dimension using the Moiré measurement method. In order to measure the lateral movement in the x and y direction two measurement gratings 48 and detector gratings 74 disposed orthogonally in relation to one another are respectively provided. FIG. 6 illustrates a first embodiment of the Moiré measurement method. In this case the period of the measurement grating 48 is chosen such that the period of its aerial image 84 at the location of the detector grating 74 deviates slightly from the period of the detector grating 74. The measurement grating 48 imaged to a smaller scale by the projection optics 26, which can also be called the object grating, produces on the substrate side an aerial image structure with the period $P_L$. Located in a plane conjugated to the substrate plane, as already described above in different embodiments, is the detector grating 74, also called the image grating, the period $P_D$ of which differs slightly from the period of the aerial image. The superposition of the aerial image 84 and the detector grating 74 leads to a spatially periodic intensity modulation of a Moiré structure 86 with the period $P_M$, as shown in FIG. 6. The correlation $$P_L = \frac{S}{S+1} \cdot P_D \tag{1}$$

between the aerial image period $P_L$ and the detector grating period $P_D$ ensures that the Moiré period $P_M$ is greater by the amplification factor S than the detector grating period $P_D$.

$$P_M = \frac{P_L \cdot P_D}{P_D - P_L} = S \cdot P_D \tag{2}$$

The two-dimensional sensor 76a and 76b measures the spatial progression of the intensity behind the detector grating 74. The intensity progression I(x) is shown in FIG. 6 as a diagram beneath the Moiré structure 86. The period of the aerial image 84 need not be resolved. It is sufficient if the Moiré period is resolved. The spatial progression of the Moiré intensity, in particular the spatial position of the intensity minima of the Moiré structure 86 allows one to come to a conclusion with regard to the movement between the aerial image 84 and the detector grating 74. The movement of the intensity minimum is greater by factor S than the movement of the aerial image 84.

Therefore, aerial image movements are easier to measure than with a directly imaging sensor with which a spatial focal point of the intensity or other criteria, such as e.g. a maximum gradient or an edge position of an imaged structure are used to measure the movement. From the intensity progression of the Moiré pattern determined with the locally resolving two-dimensional sensor 76a and 76b the phase position of the Moiré is determined numerically. For this purpose different algorithms can be used, such as e.g. the so-called shift method, the fast Fourier transformation (FFT) or the phase stage method. All of these evaluation methods known to the person skilled in the art initially only determine the phase position in relation to the two-dimensional sensor 76a and 76b. Particular attention should be paid to the material measure between the camera image and the sensor 76a and 76b. For this purpose marks can be applied to the detector grating 76 which are connected to the reference system of the sensor 76a and 76b and which appear in the camera image. The marks are evaluated simultaneously or contemporaneously with the Moiré structure and at any time establish the material measure.

Figure 7:
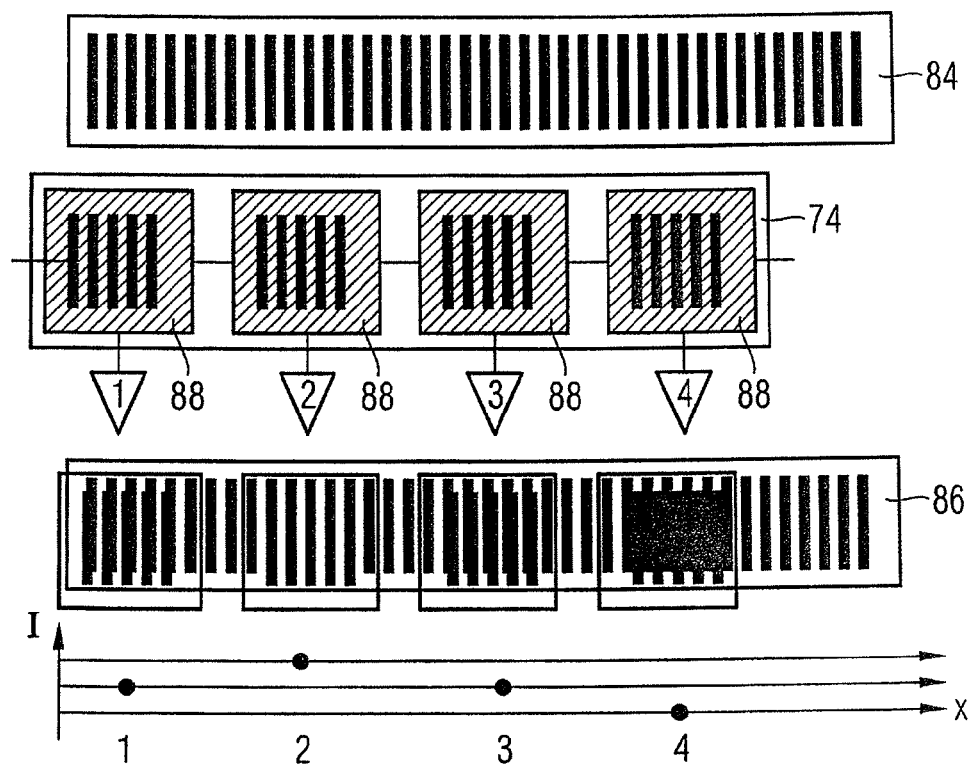

FIG. 7 illustrates a further embodiment of the evaluation of the relative movement of the measurement grating 48 in relation to the detector grating 74 using the Moiré measurement method. In this embodiment the detector grating 74 has four partial gratings 88, the periods of the partial gratings 88 respectively having the same period as the measurement grating 48 when imaging onto the detector grating 74. The adjacent partial gratings 88 are respectively disposed with a period offset by a quarter of the period of the measurement grating 48 in relation to one another when imaging onto the detector grating 74. The detector grating 74 can also comprise more than four partial gratings 88. Four partial gratings 88 are sufficient, however, because four pixels suffice in order to reconstruct the Moiré phase.

When implementing the Moiré measurement method according to FIG. 7, the sensor 76a or 76b according to FIG. 5 can be individual photodiodes or a photodiode line. For reasons relating to intensity comparably large-scale sensors are preferred. The geometry of the detector grating 74 is adapted to the sensor geometry. As already described above, the detector grating 74 is divided into four partial gratings 88 or zones which have the same period but different phases in relation to one another. The individual partial gratings 88 are respectively moved by a quarter period in relation to one another. The integrated intensity is measured in the zone of each partial grating 88. The movement x of the aerial image 84 to the detector grating 74 is taken from the phase position ϕ.

$$\varphi = \arctan\left(\frac{I_4 - I_2}{I_3 - I_1}\right); \tag{3}$$

$$x = P_L \cdot \frac{\varphi}{2\pi}$$

The control loop should keep the current movement value x as constant as possible during the exposure process.

FIG. 8 and FIG. 9 illustrate a section on the mask side of a further embodiment of a projection exposure system 10 according to the invention. This projection exposure system 10 differs from the projection exposure system 10 shown in FIG. 1 in that both the mask structures 20 and the measurement structure 48 are imaged with just one radiation source, i.e. the first radiation source 23 producing the EUV radiation. The illumination beam 25 produced by the illumination system 22 is radiated obliquely onto the mask 18 in the form of a reflection mask.

The propagation direction of the beam 95 reflected by the mask 18, which hereafter passes through the projection optics 26, is tilted in relation to the reverse propagation direction of the illumination beam 25. This tilt is for example 12°, i.e. the illumination beam 25 is tilted by 6° in relation to the surface normal of the mask 18. The projection exposure system 10 according to FIGS. 8 and 9 has a diverting device 89 for diverting a measurement beam 96 from the illumination beam 25. The diverting device 89 comprises a coupling/uncoupling device 90 in the form of a multilayer mirror and a measurement mirror 92 onto which the measurement structure 48 in the form of absorber grating structures is applied. In the example shown the coupling/uncoupling device 90 is in the form of a mirror which performs both a coupling and an uncoupling function, as described below. Alternatively the coupling/uncoupling device 90 can also have two separate mirrors, one for the coupling function and one for the uncoupling function.

FIG. 8 shows the diverting device 89 in a top view onto the plane which is spanned by the propagation vector 25a of the illumination beam 25 and the propagation vector 95a of the tilted reflected beam 95, and FIG. 9 shows the diverting device 89 in a view rotated by 90° about the surface normal of the mask 18. In the view according to FIG. 9 the reflected beam 95 conceals the illumination beam 25 lying behind the latter.

The coupling/uncoupling device 90 is disposed in the optical path of the illumination beam 25 such that a partial beam 94 of the illumination beam 25 is directed by the coupling/uncoupling device 90 onto the measurement structure 48 of the measurement mirror 92. The measurement mirror 92 is disposed such that the partial beam 94 is reflected back by the latter to the coupling/uncoupling device 90 as a measurement beam 96, and is coupled by the latter into the optical path of the beam 95 reflected by the mask 18. The coupled measurement beam 96 has the same propagation direction as the reflected beam 95. The diverting device 89 is configured such that the optical path length for the partial beam 94 diverted from the illumination beam 25 by the coupling/uncoupling device 90 is identical up to entry as a measurement beam 96 into the optical path of the reflected beam 95 to the optical path length which the radiation of the partial beam 93 not diverted on the coupling/uncoupling device 90 has passed through up to entry of the measurement beam 96 into the reflected beam 95.

As can be seen from FIG. 9, the coupling/uncoupling device 90 is disposed such that the partial beam 94 directed by this mirror onto the measurement structure 48 is tilted in relation to the plane which is spanned by the illumination beam 25 and the tilted reflected beam 95, i.e. the plane of the drawing according to FIG. 8. The tilting is to such an extent that the measurement mirror 92 is disposed outside of the optical path of the reflected beam 95 projected along the spanned plane, as illustrated in FIG. 9.

Figure 11:
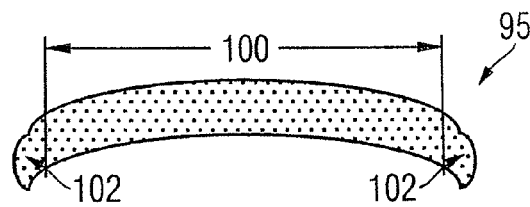

The coupling/uncoupling device 90 is disposed in a region of the illumination beam 25 or of the reflected beam 95 which is generally used for dose control. FIG. 11 illustrates a cross-section of the reflected beam 95 which has a region 100 used for imaging the mask structures 20 and two regions 102 used with conventional systems for the dose measurement. The diverting device 89 is disposed such that the region 102 is used for measuring the lateral image position. The evaluation device 54 according to FIG. 1 is further configured to establish a radiation intensity from the image of the measurement structures 48 recorded by the detectors 52 and to control the dose of the radiation provided by the radiation source 23 using the radiation intensity established. In other words, the dose control function is further fulfilled by the beam regions 102 provided for this with conventional systems. The region 100 used for imaging is not impaired any further.

FIG. 10 shows the section on the substrate side of the projection exposure system 10 according to FIGS. 8 and 9. The latter differs substantially from the section shown in FIG. 5 in that in all cases mirrors 72 are used for uncoupling the measurement beam because the wavelength of the measurement beam 96 is in the EUV range. The detector gratings 74 can be in the form of transmission gratings which have absorber structures on an EUV-transmitting membrane made e.g. of Si—$Si_3N_4$ or zircon. The detector gratings 74 can also be in the form of absorber gratings written directly onto the sensor 76a or a quantum converter 98. The locally resolving two-dimensional sensor can be an EUV CCD camera 76a or an arrangement 76c comprising a quantum converter 98 in the form of a scintillator fluorescence glass with an adjoining micro objective 80 and a CCD camera 99. A scintillator and a fluorescence material can also be disposed on an image guide to which a CCD camera adjoins. In this case the camera can be disposed outside of the vacuum chamber. The detector 52 can be designed to produce images in order to implement the Moiré measurement method according to FIG. 6 or with multi-channels in order to implement the Moiré measurement method according to FIG. 7. It is possible to use EUV photodiodes and diode lines and to write the sensor grating lithographically directly onto the diodes. Alternatively, a freely supporting membrane with absorber gratings can be positioned in front of the photodiodes.

Figure 12:
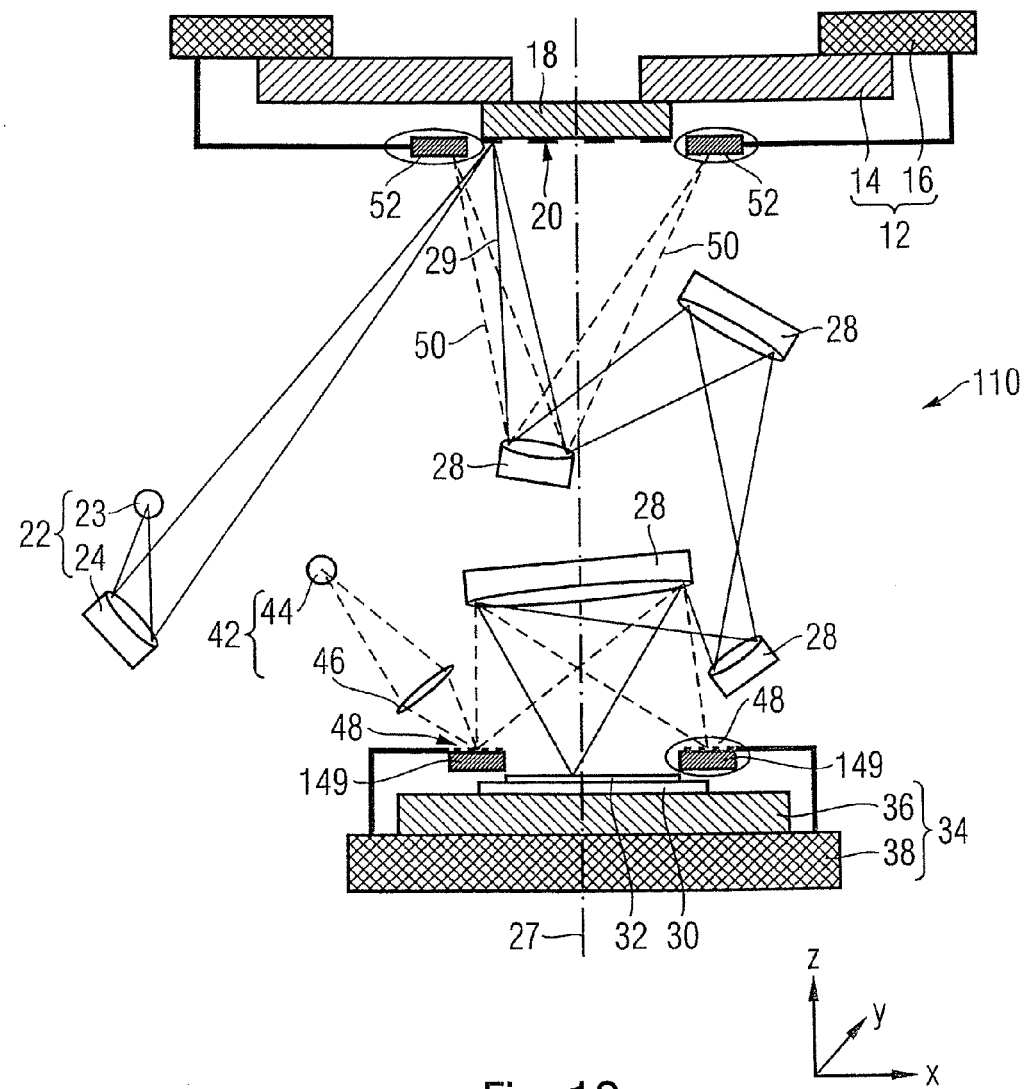

FIG. 12 shows a further embodiment 110 of a projection exposure system according to the invention. This embodiment differs from the projection exposure system according to FIG. 1 in that the measurement gratings 48 are not disposed on the mask side as in FIG. 1, but on the substrate side. In the embodiment according to FIG. 12 the detectors 52 are disposed on the mask side instead of on the substrate side according to FIG. 1. The measurement gratings 48 according to the embodiment shown in FIG. 12 are respectively disposed on a mirror 149. One thus avoids disposing the illumination system 42 in the region of the substrate table 34. In an alternative embodiment of the illumination system 42 the second radiation source 44 is in the form of LED and the illumination optics 46 have appropriate microlenses. Therefore, the illumination system 42 is sufficiently miniaturised in order to be able to fit into the available space within the frame identified by reference number 149. In this case the measurement structure 48 can be in the form of a transmission structure without an assigned mirror. This embodiment of the illumination system can also be used in the projection exposure system according to FIG. 1.

Figure 13:
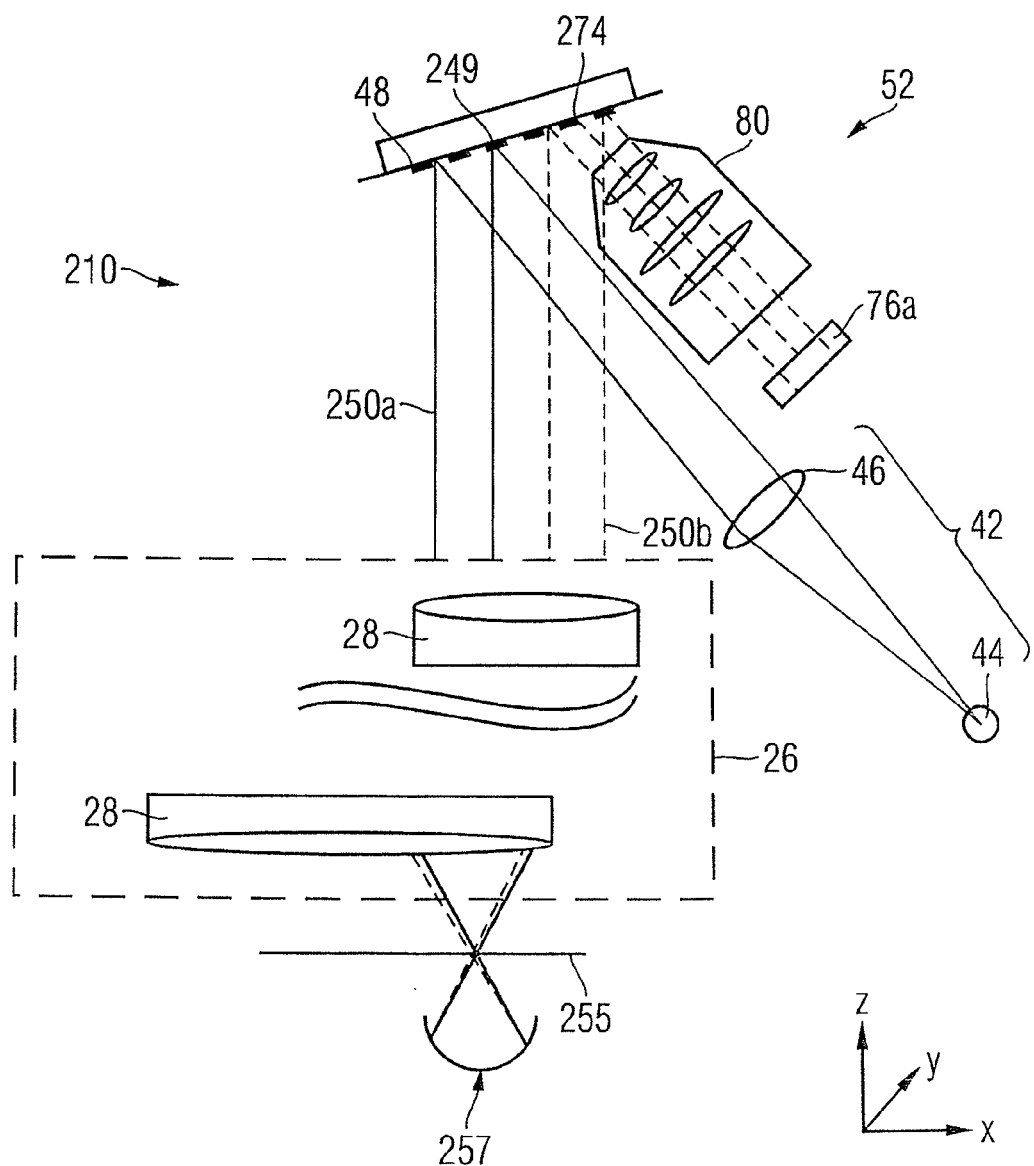

FIG. 13 shows a further embodiment 210 of a projection exposure system according to the invention. This embodiment differs from the projection exposure system according to FIG. 1 in that both the measurement structures 48 and the detectors 52 are disposed on the mask side. The radiation produced by the illumination system 42 passes through the projection optics 26 in an incoming optical path 250a after reflection on a measurement structure 48 disposed on a mirror 249 and is reflected back into the projection optics 26 with a cat's eye reflector 257 disposed beneath the image plane 255. The cat's eye reflector 247 reflects the incoming wave such that the latter susbstantially runs back into itself. For this purpose the latter is e.g. spherical. The field point on the substrate side conjugated to the field point of the measurement structure 48 sits close to the center point of the sphere. The cat's eye reflector 257 is material measured with the same precision as the detector 52 and is attached securely in position on the reference frame 38 of the substrate table 34.

The radiation reflected by the cat's eye reflector 257 passes through the projection optics 26 once again into a returning optical path 250b, which only differs slightly from the incoming optical path 250a, and is reflected on a detector grating 274 also disposed on the mirror 249 and recorded by a locally resolving two-dimensional sensor 76a, for example in the form of a CCD camera. The cat's eye reflector 257 is adjusted such that the image of the measurement structure 48 comes to lie on the detector grating 274 so that the Moiré measurement method described above can be used. The embodiment according to FIG. 13 uses the available space on the mask side which is generally dimensioned more generously in comparison to the substrate side. The line width of the detector grating 274 is greater in comparison to an arrangement of the detector 52 on the substrate side by the imaging scale of the projection optics 26, generally 4 or 5. This facilitates the production of the detector grating 274.

Figure 14:
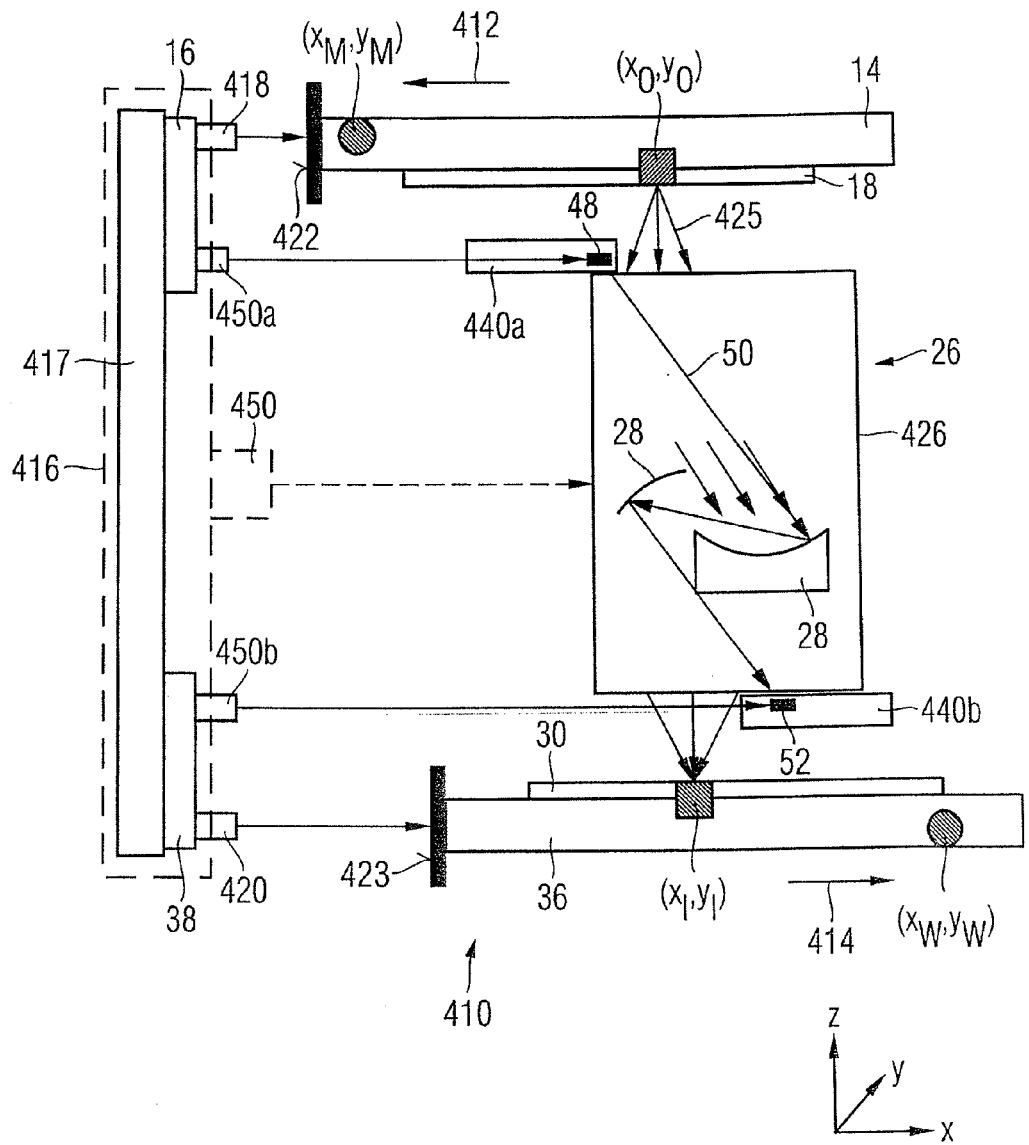

FIG. 14 shows a projection exposure system 410 in an embodiment according to the invention deviating from the projection exposure system 10 according to FIGS. 1 and 2 substantially in that the measurement structure 48 and the detector 52 of the measurement device 40 for determining the lateral position of the image of the measurement structure 48 are not attached to the reference frames 16 and 38, respectively. Instead, the measurement structure 48 and the detector 52 of the projection exposure system 410 are attached to a housing 426 of the projection optics 26. The projection optics 26 can also be referred to as projection objective. Instead of having the measurement structure 48 and the detector 52 attached rigidly to the associated reference frame 16 and 38, as in the projection exposure system 10 according to FIG. 1, the measurement structure 48 and the detector 52 are disposed in a defined position with respect to the associated reference frame 16 and 38, respectively.

The defined positions are obtained by measurement of the respective distance of the measurement structure 48 and the detector 52 from the associated reference frame 16 and 38, respectively. For this purpose distance sensors 450a and 450b, e.g. in the form of interferometers, are arranged at the respective reference frames 16 and 38. During exposure operation of the projection exposure system 410 the respective position of the measurement structure 48 and the detector 52 are continuously monitored by the distance sensors 450a and 450b. The reference frames 16 and 38 according to FIG. 14 are attached to a common reference structure 417, e.g. in the form of a frame of the projection exposure system 410. The distance sensors 450a and 450b can alternatively also be arranged on a single reference element 416, which e.g. can be the frame of the projection exposure system 410 or another element thereof.

Further, the distance sensors 450a and 450b can be arranged at two reference elements which are connected to several further reference elements, wherein the relative positions and orientations of the reference elements towards each other are monitored using sensors. According to an embodiment sensors are provided, which monitor a thermal expansion or other fluctuations of the reference structures, such as the reference frames 16 and 38, the common reference structure 417 or the single reference element 416.

In an alternative embodiment only one distance sensor 450, shown in FIG. 14 with dashed lines, is provided for measuring the defined positions of the measurement structure 48 and the detector 52. This distance sensor 450 can be attached to the single reference element 416 or alternatively to one of the reference frames 16 and 38. The distance sensor 450 measures the distance to the housing 426 of the projection optics 26. Therefrom the positions of the measurement structure 48 and the detector 52 relative to the respective reference element can be determined.

The lateral position of the image of the measurement structure 48 on the detector 52, established during the exposure process, is referenced to the positions of the reference frames 16 and 38, respectively or the reference element 416 by the evaluation device 54 using the determined positions of the measurement structure 48 and the detector 52. This referencing of the established lateral position allows imaging instabilities of the projection exposure system 410 to be established and corrected precisely as will become more clear in the following.

The projection exposure system according to FIG. 14 is configured as a step and scan system. The scan direction 412 of the mask holding device 14, also referred to as mask stage, during the exposure process of exposing one field on the substrate 30 is indicated by an arrow. In the coordinate system of FIG. 14 the scan direction 412 is along the x-coordinate axis. The substrate holding device 36, also referred to as wafer stage, is scanned during the exposure process simultaneously or contemporaneously in the opposite direction indicated by arrow 414. The stages are thereby moved relative to each other such that a test point $(x_M, y_M)$ on the mask holding device 14 and a test point $(x_W, y_W)$ on the substrate holding device 36 have the following coordinate relationship to each other:

$$x_W = \beta \cdot x_M + \Delta x_W \text{ and } y_W = \beta \cdot y_M + \Delta y_W, \quad (4)$$

wherein β is the optical magnification of the projection optics 26. $\Delta x_W$ and $\Delta y_W$ describe positioning deviations of the substrate holding device 36 from its target positions during the scan process, also referred to as stage positioning errors. These stage positioning errors can be systematic or random. Systematic stage positioning errors cause a distortion of the structures printed onto the substrate 30. Random stage positioning errors cause a smearing of the printed structures and therefore a broadening of the printed structures, also referred to as critical dimension (CD), and a reduction in contrast.

FIG. 14 further illustrates an object point $(x_O, y_O)$ on the mask 18 arranged on the mask holding device 14 and a corresponding image point $(x_I, y_I)$ in an image plane of the projection optics 26. The coordinate relationship between the object point $(x_O, y_O)$ and the image point $(x_I, y_I)$ during the exposure process relative to each other is as follows:

$$x_I = \beta \cdot x_O + \Delta x_I \text{ and } y_I = \beta \cdot y_O + \Delta y_I, \quad (5)$$

wherein $\Delta x_I$ and $\Delta y_I$ describe deviations of the actual position of the image point from its target position in the coordinate system of FIG. 14. Put in different words, $\Delta x_I$ and $\Delta y_I$ describe deviations from the target relationship between the positions of the object point and the image point. These deviations are caused by instabilities in the imaging properties of the projection optics 26. $\Delta x_I$ and $\Delta y_I$ correspond to deviations of the lateral position of the image of the measurement structure 48 from its target position on the detector 52 measured by the measurement device 40 in form of the so called "line of sight sensor".

Deviations $\Delta x_S$ and $\Delta y_S$ define deviations of the position of the image of a mask structure 20 or printed structure from its target position on the substrate 30, i.e. in the coordinate system of the substrate 30. The deviations $\Delta x_I$ and $\Delta y_I$ of the image point and the positioning deviations $\Delta x_W$ and $\Delta y_W$ of the Substrate Holding Device 36 contribute to the deviations $\Delta x_S$ and $\Delta y_S$ of the printed structure as follows:

$$\Delta x_S = x_I - x_W = \Delta x_I - \Delta x_w \text{ and } \Delta y_S = y_I - y_W = \Delta y_I - \Delta y_W, \quad (6)$$

wherein $x_M = x_O$ and $y_M = y_O$.

Statistically independent variations in the positions of the image point $(x_I, y_I)$ and the substrate test point $(x_W, y_W)$ add up quadratically and enlarge the critical dimension (CD) of the printed image. In order to optimize the critical dimension both positioning deviations need to be adjusted for. This is achieved in the embodiment according to the invention shown in FIG. 14 by combining a line of sight sensor of the type designated by 40 in FIG. 1 with stage sensors 418 and 420.

The stage sensors 418 and 420, e.g. in the form of interferometers, monitor the stage movements, i.e. the movements of the mask holding device 14 and the substrate holding device 36, during the exposure process. Specifically a mask stage sensor 418 is attached to the reference frame 16 and measures the exact distance between the reference frame 16 and a reference surface 422 of the mask holding device 14 continuously during the scan movement. A substrate stage sensor 420 is attached to the reference frame 38 and measures the exact distance between the reference frame 38 and a reference surface 423 of the substrate holding device 36 continuously during the scan movement. The stage sensors 418 and 420 therefore allow to monitor lateral variations in the movements of the mask holding device 14 and the substrate holding device 36 from their target movements.

The line of sight sensor in form of the measurement device 40 is illustrated schematically in FIG. 14 by a mask side portion 440a and a substrate side portion 440b of the measurement device 40, wherein, as already detailed above, the measurement structure 48 and the detector 52 are attached to the projection objective, also referred to as projection optics 26.

Referring to equations (4) to (6) above, the line of sight sensor provides $(\Delta x_I, \Delta y_I)$ and the stage sensors 418 and 420 provide $(\Delta x_W, \Delta y_W)$ as measurement results. Therefrom the deviations $(\Delta x_S, \Delta y_S)$ of the position of the image from its target position on the substrate 30 is calculated continuously during the exposure process using equation (6) by the evaluation device 54 shown in FIG. 1. Thereby the evaluation device 54 takes movements of the measurement structure 48 and the detector 52 with respect to the reference frames 16 and 38, respectively, or the reference element 416, depending on the configuration, as measured by the distance sensors 450a and 450b or the distance sensor 450 into account. This way the measurement results $(\Delta x_I, \Delta y_I)$ provided by the line of sight sensor and $(\Delta x_W, \Delta y_W)$ provided by the stage sensors 418 and 420 are referenced relative to each other, which allows the deviations $(\Delta x_S, \Delta y_S)$ to be calculated with high precision.

Figure 15:
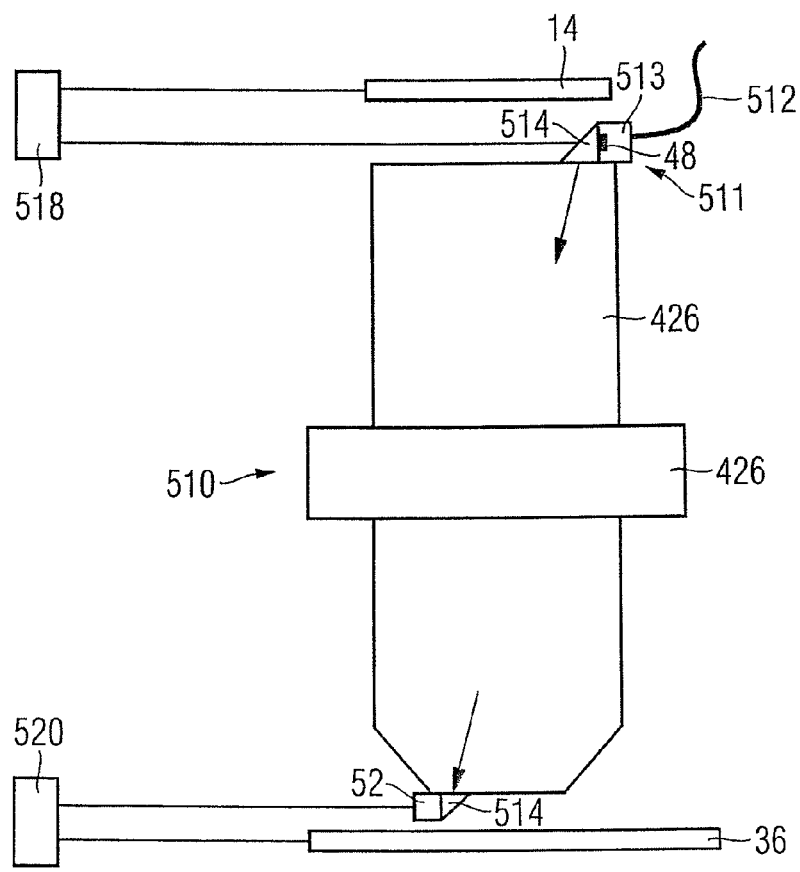

An embodiment 510 of a projection exposure system shown in FIG. 15 differs from the embodiment 410 shown in FIG. 14 in that the functions of the sensors 418 and 450a are combined in a single mask stage sensor module 518 and the functions of the sensors 420 and 450b are combined in a single substrate stage sensor module 520. The sensor modules 518 and 520 can e.g. each contain two interferometers, one for measuring the distance to the mask holding device 14 and the substrate holding device 36, respectively, and one for measuring the distance to the measurement structure 48 and the detector 52, respectively.

In the embodiment according to FIG. 15 the measurement structure 48 is part of a feed device 511 for feeding the measurement radiation 47 depicted to FIG. 1 into the optical path of the projection optics 26. The radiation 47 is provided by an optical fiber 512, which is connected to a coupling element 513 of the feed device 511. The feed device 511 further comprises a deflecting prism 514 for deflecting the radiation 47 into the projection optics 26. The feed device 511 is attached firmly to the top of the housing 426 of the projection optics 26, while the detector 52 is together with a further deflecting prism 514 attached firmly to the bottom of the housing 426. As the measurement structure 48 and the detector 52 are fixed to the housing 426, the sensor modules 518 and 520 can also be configured to measure the distance to the top and bottom portions of the housing 426 of the projection optics 26, respectively.

In a further embodiment according to the invention the sensor module 518 is configured as an optical position encoder to directly measure the relative position between the mask holding device 14 and the top of the housing 426 of the projection optics 26. An embodiment of such an optical position encoder comprises two gratings, one being arranged on the mask holding device 14 and the other one on the housing of the projection optics 26. A light source generates measuring light, which passes through both gratings and is subsequently detected by several photo detectors. From the signals received by the photo detectors the relative position of the two gratings to each other is determined. The encoder is based on an interferometric position measuring method. The sensor module 520 can be configured correspondingly in form of an optical encoder in order to directly measure the relative position between the substrate holding device 16 and the bottom of the housing 426 of the projection optics 26.

The deviation information $(\Delta x_S, \Delta y_S)$ of the position of the image from its target position on the substrate 30 calculated by the evaluation device 54 during the exposure process is used to manipulate the operation of the projection exposure system in real time in order to correct for the deviation immediately. In an example of this manipulation the position of one of the reflective optical elements 28 of the projection optics 26 is changed, as described above with respect to FIG. 3.

Figure 16:
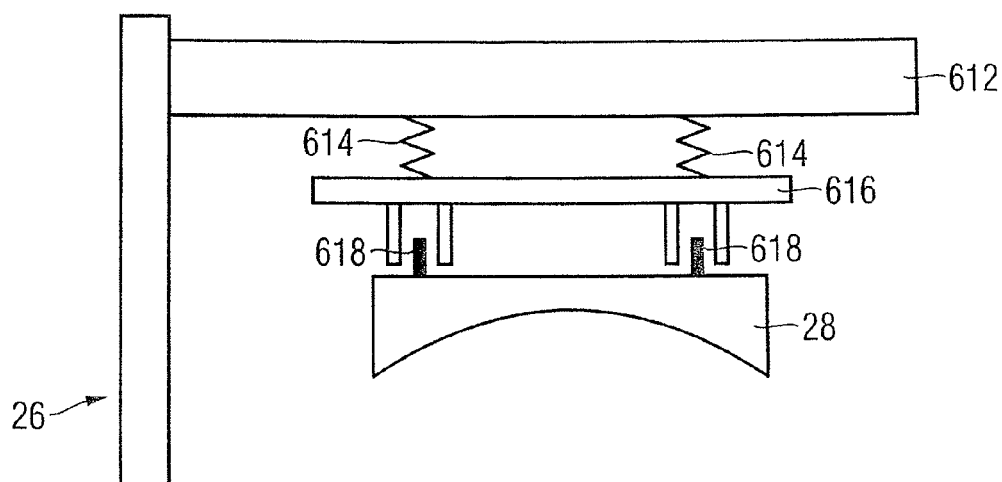

FIG. 16 shows a portion of projection optics 26 including an actuation module for manipulating the position of an optical element 28 in an embodiment according to the invention. Here the optical element 28 can be moved and tilted via at least two positioning devices 618, also referred to as actuators, with respect to a counter mass 616. The counter mass 616 is connected via spring elements 614 to a holding frame 612 of the projection optics 26. The counter mass 616 and the spring elements 614 are specifically configured to avoid undesired vibrations of the holding frame 612 as a result of reaction forces due to fast movements of the positioning devices 618 during operation. This way, fast manipulations of the position of the optical element 28 to be moved are possible without negatively affecting the positional stability of other optical elements 28 of the projection optics 26.

Figure 17:
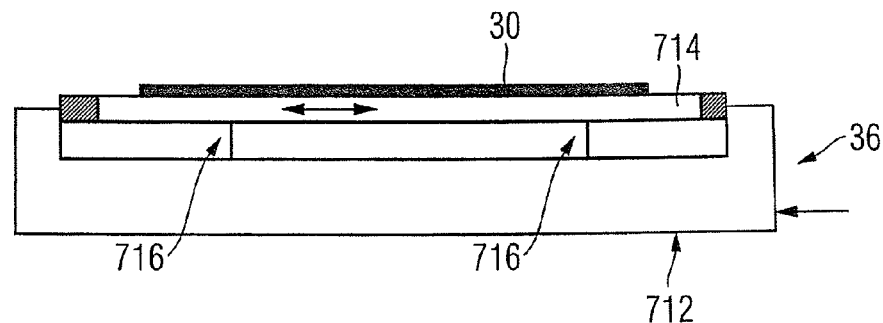

Another possibility of manipulating the operation of the projection exposure system in order to correct the measured image deviation $(\Delta x_S, \Delta y_S)$ on the substrate 30 is described referring to FIG. 17. Therein an embodiment of a substrate holding device 36 is shown, which comprises a base part 712 and an adjustment part 714 for holding the substrate 30. The adjustment part 714 is mounted with pivots 716 to the base part 712 such that it can be moved with respect to the base part 712 in a plane parallel to the substrate 30. This movement is performed by actuators during the exposure process in order to correct the measured image deviations $(\Delta x_S, \Delta y_S)$ on the substrate 30 immediately. In an alternative solution the movement of the mask holding device 14 and/or the overall substrate holding device 36 is controlled such that the image deviations $(\Delta x_S, \Delta y_S)$ on the substrate 30 are corrected accordingly.

Figure 18:
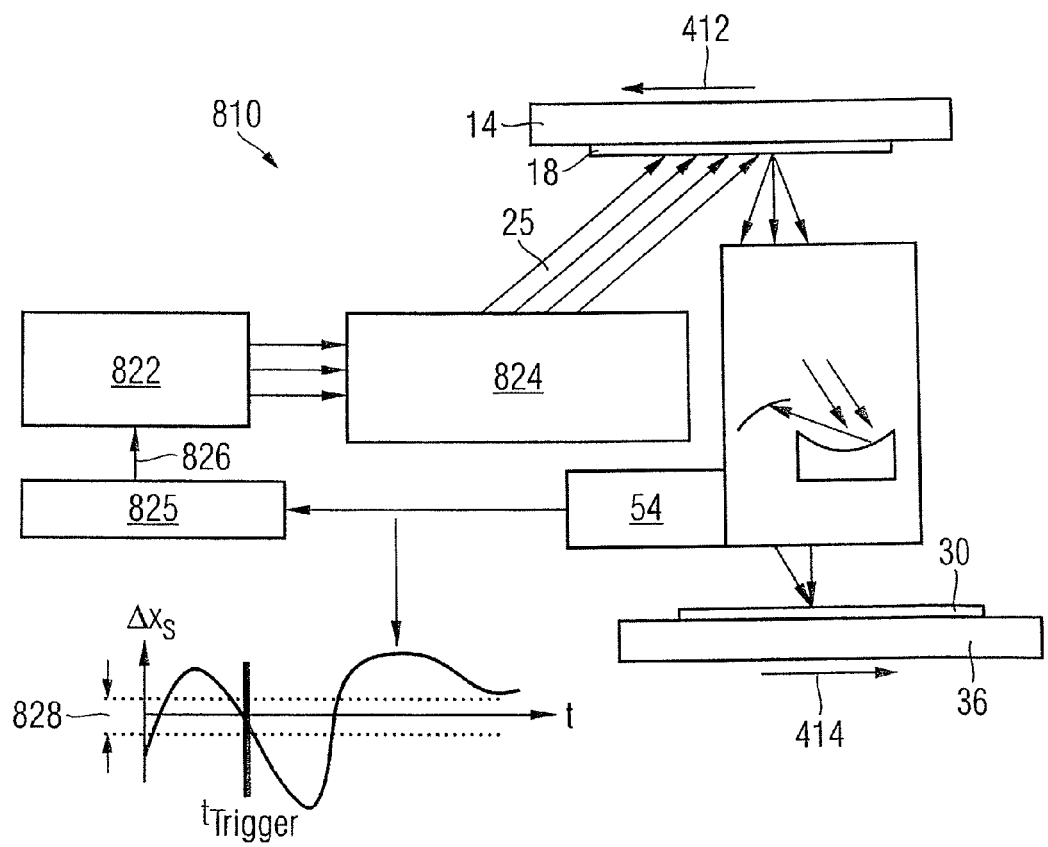

A further possibility of manipulating the operation of the projection exposure system in order to correct the measured image deviation $(\Delta x_S, \Delta y_S)$ on the substrate 30 is described referring to FIG. 18. This Figure shows a projection exposure system 810 of any of the above described types comprising a pulsed radiation source 822 for producing the exposure radiation 25, which is directed by illumination optics 824 onto the mask 18. The evaluation device 54 delivers a time resolved signal of $\Delta x_S$ and $\Delta y_S$, as shown exemplary for $\Delta x_S$ in FIG. 18, to a trigger device 825. The trigger device 825 controls the radiation source 822 such, that a pulse of radiation is released at a point in time, at which the image deviation $(\Delta x_S, \Delta y_S)$ on the substrate 30 is within a predetermined tolerance 828.

The above description of the preferred embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. A projection exposure system for microlithography comprising:

projection optics arranged to image mask structures disposed in a mask holding device onto a substrate disposed in a substrate holding device during an exposure process, a measuring system configured to monitor lateral imaging stability of the projection optics, wherein at least one element of the measuring system is disposed in a fixed position in relation to the projection optics, and at least one sensor module configured to measure a distance between the at least one element and the mask holding device and/or the substrate holding device.

2. The projection exposure system as claimed in claim 1, wherein the element of the measuring system is configured as a component of the projection optics.

3. The projection exposure system as claimed in claim 1, wherein the element of the measuring system is fixed to a housing of the projection optics.

4. The projection exposure system as claimed in claim 1, wherein the sensor module is configured as an optical position encoder encoding relative positions between the projection optics and the mask holding device and/or the substrate holding device.

5. The projection exposure system as claimed in claim 1, wherein the measurement system comprises an evaluation device configured to establish a lateral imaging stability using the distance measurement of the sensor module.

6. The projection exposure system as claimed in claim 5, further comprising a pulsed radiation source providing illumination radiation for imaging the mask structures onto the substrate, and a control device configured to trigger the radiation source based on the lateral imaging stability over time established by the evaluation device such that ft the illumination radiation is provided only at times at which the lateral position of the image of the mask structures is within a predetermined tolerance with respect to a target position.

7. The projection exposure system as claimed in claim 5, wherein the projection optics comprise a positioning device configured to change a position of an optical element of the projection optics in accordance with the established lateral imaging stability.

8. The projection exposure system as claimed in claim 5, further comprising a control device configured to modify at least one of the position of the mask holding device and the position of the substrate holding device during the exposure process, thereby correcting the lateral imaging instabilities.

9. The projection exposure system as claimed in claim 1, wherein the measuring system is configured to monitor the lateral imaging stability of the projection optics using measurement radiation passing through the projection optics.

10. The projection exposure system as claimed in claim 9, wherein the at least one element of the measuring system is arranged in the beam path of the measurement radiation.

* * * * *

UNITED STATES PATENT AND TRADEMARK OFFICE
CERTIFICATE OF CORRECTION

PATENT NO. : 9,696,639 B2  
APPLICATION NO. : 14/679221  
DATED : July 4, 2017  
INVENTOR(S) : Ulrich Mueller It is certified that error appears in the above-identified patent and that said Letters Patent is hereby corrected as shown below:

On the Title Page

Column 1, After entry "(63) ... which is a (Continued)" insert Item (30) -- Foreign Application Priority Data Jan. 16, 2008 (DE) 10 2008 004 762.7 --, as a new entry.

In the Specification

Column 5, Line 19, Delete "structure." and insert -- structure --, therefor.

Column 5, Line 64, Delete "and or" and insert -- and/or --, therefor.

Column 26, Line 31, Delete "susbstantially" and insert -- substantially --, therefor.

Column 28, Line 36, Delete "Substrate Holding Device" and insert -- substrate holding device --, therefor.

Column 28, Line 39, Delete "$\Delta x_S = x_I - x_W = \Delta x_i - \Delta x_w$ and $\Delta y_S = y_I - y_W = \Delta y_i - \Delta y_w$," and insert -- $\Delta x_S = x_I - x_W = \Delta x_i - \Delta x_w$ and $\Delta y_S = y_I - y_W = \Delta y_i - \Delta y_w$, --, therefor.

In the Claims

Column 32, Line 6, In Claim 6, after "that" delete "ft".

Signed and Sealed this  
Sixth Day of October, 2020

Andrei Iancu  
*Director of the United States Patent and Trademark Office*